United States Patent
Nakamura et al.

[11] Patent Number: 5,905,685
[45] Date of Patent: May 18, 1999

[54] DYNAMIC MEMORY

[75] Inventors: Masayuki Nakamura; Masatoshi Hasegawa, both of Ome; Seiji Narui, Hamura; Yousuke Tanaka, Ome; Shinichi Miyatake, Hamura; Shuichi Kubouchi, Fussa; Kazuhiko Kajigaya, Iruma, all of Japan

[73] Assignees: Hitachi, Ltd.; Hitachi ULSI Engineering Corp., both of Tokyo, Japan

[21] Appl. No.: 08/951,734

[22] Filed: Oct. 15, 1997

[30]     Foreign Application Priority Data

Oct. 25, 1996  [JP]  Japan .................................. 8-301222

[51] Int. Cl.⁶ ..................................................... G11C 7/00
[52] U.S. Cl. ........................................... 365/207; 365/205
[58] Field of Search .................................... 365/205, 207, 365/203, 230.03; 327/52, 55, 57

[56]             References Cited
          U.S. PATENT DOCUMENTS 5,446,694   8/1995   Tanaka et al. ........................... 365/205

FOREIGN PATENT DOCUMENTS

| 2-5290 | 1/1990 | Japan . |
| 5-12866 | 1/1993 | Japan . |
| 5-89673 | 4/1993 | Japan . |
| 6-215566 | 8/1994 | Japan . |
| 6-215572 | 8/1994 | Japan . |

*Primary Examiner*—Tan T. Nguyen
*Attorney, Agent, or Firm*—Antonelli, Terry, Stout & Kraus, LLP

[57]                ABSTRACT

In a dynamic RAM having a memory cell array in which a dynamic memory cell is arranged at an intersection between a word line and one of a pair of bit lines, a select level signal corresponding to a supply voltage and an unselect level signal corresponding to a negative potential lower than circuit ground potential are supplied to the word line. A signal of a memory cell read to the pair of bit lines by a sense amplifier that operates on the circuit ground potential and an internal voltage formed by dropping the supply voltage by an amount equivalent to the threshold voltage of the address select MOSFET is amplified. The dynamic RAM has an oscillator that receives the supply voltage and circuit ground potential and a circuit that receives an oscillation pulse generated by the oscillator to generate the negative potential.

16 Claims, 14 Drawing Sheets

P-SUB DOUBLE WELL

P-SUB TRIPLE WELL

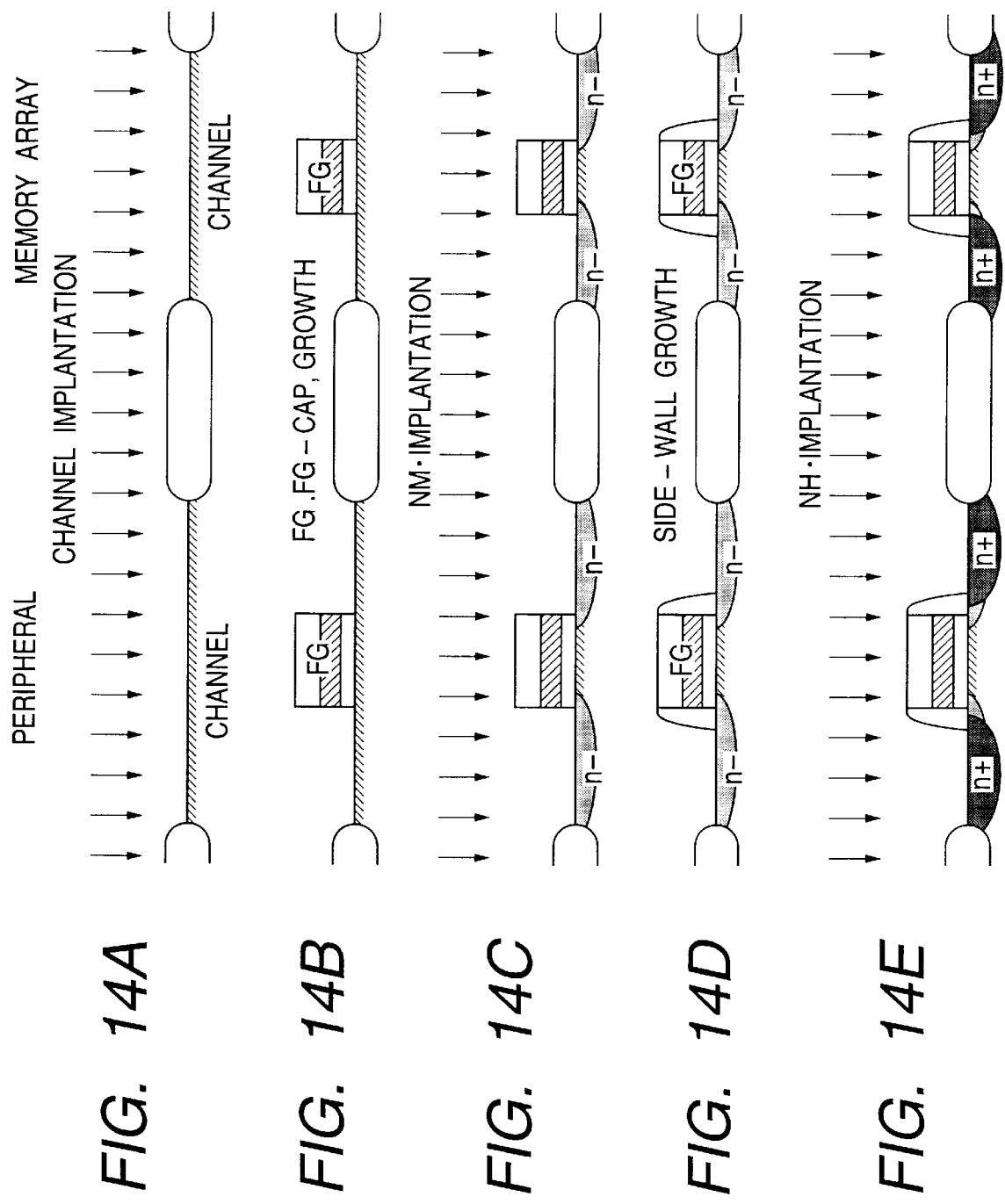

DYNAMIC MEMORY

BACKGROUND OF THE INVENTION

The present invention relates to a dynamic RAM (Random Accesss Memory) and a semiconductor integrated circuit and to a technology for valid use in a memory access technique for accessing dynamic memory cells.

A dynamic RAM is known in which a back bias voltage to be supplied to a substrate and a boosted select voltage for selecting a word line are formed by a voltage generator using a built-in charge pump circuit.

The use of an external supply voltage for the voltage as selecting a word line or lowering a unselect voltage for not selecting a word line is described in Japanese Patent Laid-Open Nos. Hei 2-5290, Hei 5-89673, Hei 6-215566, Hei 6-215572, and Hei 5-12866.

A dynamic memory cell consists of an address select MOSFET (Metal-Oxide Semiconductor Field-Effect Transistor) and an information storage capacitor. An information storage operation is performed whether this capacitor is charged or not. To extend the formation retention time in the charged state, it is required to supply a negative back bias voltage to a substrate gate (a channel section) on which the address select MOSFET is formed to raise its effective threshold voltage. In a MOSFET constituting a peripheral circuit for address-selecting the above-mentioned dynamic memory cell and a sense amplifier and main amplifier, when a negative back bias voltage is applied to the substrate gate, the threshold voltage increases by that amount and the conductance in the on state decreases, slowing the operation speed. To solve this problem, a method has been proposed in which such a back bias voltage is supplied only to the memory array section on which the dynamic memory cell is formed. However, such a constitution requires that the well region on which the memory array section is formed be separated from the well region on which the above-mentioned peripheral circuit is formed, making the fabrication process complicated.

In writing at high level to the dynamic memory cell, the information storage capacitor is charged up via the address selecting MOSFET, and the charge-up level is lowered by an amount equivalent to the threshold voltage of the address select MOSFET, thereby reducing the amount of the information charge. To prevent the charge-up level from being lowered, the select level of the word line connected to the gate of the above-mentioned address select MOSFET is set to a voltage boosted by a threshold voltage for the high level to be transmitted to a bit line. Thus, prior-art dynamic RAMs require a boosted voltage for a word line selecting operation and a charge pump circuit for forming the above-mentioned back bias voltage, thereby causing problems, such as a comparatively large occupancy area and increased current consumption.

SUMMARY OF THE INVENTION

We found that use of a booster such as mentioned above involves a problem of making highly dielectric an element forming such a boosted voltage and a problem of increasing current consumption due to extremely poor efficiency because the booster forms a voltage higher than the supply voltage and only about 40% of the current consumed in the booster may be used for boosting. In addition, the booster presents a problem of increasing a memory cell array layout area for the following reasons. For example, in a mass storage dynamic RAM of about 64 Mbits, one memory block forms a plurality of sub word lines for the main word line and each sub word line is connected to a memory cell, thereby dividing the memory block into a plurality of memory cell arrays.

The divided memory cell arrays provided for the sub word lines are laid out so as to be divided by the above-mentioned sense amplifier and a sub word driver. When a boosted voltage such as mentioned above is used, since the sub word driver outputs the boosted voltage, the sub word driver must be supplied with a bias voltage to the N-well region on which the P-channel MOSFET constituting the sub word driver is formed. On the other hand, if the boosted voltage is supplied to the N-well on which the P-channel MOSFET constituting the sense amplifier is formed, a back bias is applied and hence its threshold voltage is increased, significantly lowering the operation speed. To circumvent this problem, a supply voltage must be supplied to the N-well region on which the P-channel MOSFET of the sense amplifier is formed and the boosted voltage must be supplied to the N-well region on which the P-channel MOSFET of the sub word driver is formed. However, we found that these two N-well regions cannot be commonly formed on a deep N-well region for separating the P-well region on which the above-mentioned memory cell array is formed and to which the above-mentioned substrate back bias voltage is applied, without increasing the memory block layout area.

It is therefore an object of this invention to provide a dynamic RAM that implements high integration, high operation speed, and low power consumption. Another object of this invention is to provide a dynamic RAM that implements high integration, high operation speed, and low power consumption, while simplifying the fabrication process. The above and other objects, features and advantages of the present invention will become more apparent from the accompanying drawings, in which like reference numerals are used to identify the same or similar parts in the several views.

In carrying out the invention and according to one aspect thereof, there is provided a dynamic RAM having a memory cell array in which a dynamic memory cell is arranged at an intersection between a word line and one of a pair bit lines, wherein the select level corresponding to a supply voltage and the unselect level corresponding to a negative potential lower than the circuit ground potential are supplied to the word line, a signal of a memory cell read to the pair of bit lines by a sense amplifier that operates on the circuit ground potential and an internal voltage formed by dropping the supply voltage by an amount equivalent to the threshold voltage of the address select MOSFET is amplified, and the negative voltage is generated by a negative voltage generator that receives the supply voltage and the circuit ground potential, the negative voltage generator being composed of an oscillator and a charge pump circuit for receiving an oscillation pulse formed by the oscillator.

The above and other objects, features and advantages of the present invention will become more apparent from the accompanying drawings, in which like reference numerals are used to identify the same or similar parts in the several views.

BRIEF DESCRIPTION OF THE DRAWINGS

FIG. 14A, FIG. 14B, FIG. 14C, FIG. 14D, and FIG. 14E are cross sections illustrating a main portion of the dynamic RAM associated with the invention for describing the fabrication process according to another embodiment thereof.

DETAILED DESCRIPTION OF PREFERRED EMBODIMENTS

This invention will be described in further detail by way of example with reference to the accompanying drawings. Now referring to FIG. 1, there is shown a general layout illustrating a dynamic RAM associated with the invention, according to one embodiment thereof. In the figure, of the circuit blocks constituting the dynamic RAM, the blocks associated with the invention are illustrated. These blocks are formed by a known semiconductor integrated circuit fabrication technology on one semiconductor substrate, such as a single silicon crystal.

The dynamic RAM of this embodiment has a storage capacity of, but not necessarily, about 64 Mbits. The memory array is constituted by four memory blocks. Along the length of the semiconductor chip, two memory arrays are arranged. Between these memory arrays, there is provided an input/output interface circuit composed of an address input circuit, a data input/output circuit, and bonding pads, and a power supply generator.

As described, of the four memory blocks, the two memory blocks arranged vertically are paired. Between these two memory blocks, a main word driver MWD is provided. This main word driver MWD forms a select signal for selecting a main word line which passes one memory block. One memory block is connected to dynamic memory cells constituting a storage capacity of 4 Kbits along the main word line and dynamic memory cells constituting a storage capacity of 4 Kbits in pair bit line (also referred as a data line) direction, not shown, orthogonally intersecting the main word line. Since four memory blocks are provided, the total storage capacity is 4×4K×4K=64 Mbits.

Each of the above-mentioned memory blocks is divided into 8 memory cell arrays along the main word line. Each of these memory cell arrays is provided with a sub word driver SWD. The sub word driver SWD is divided into a length of ⅛ relative to the main word line and forms a select signal for selecting a sub word line extending in parallel to the main word line. In this embodiment, in order to reduce the number of main word lines, or reduce the wiring density of the main word lines, four sub word lines, by way of example only, are arranged for one main word line in pair bit line direction. In order to select one sub word line from the sub word lines divided into eight along the main word line and allocated in fours in the pair bit line direction, a sub word select line driver to be described later is arranged. This sub word select driver forms a select signal for selecting one of the four sub word select lines extending along the above-mentioned sub word driver array.

Figure 1:
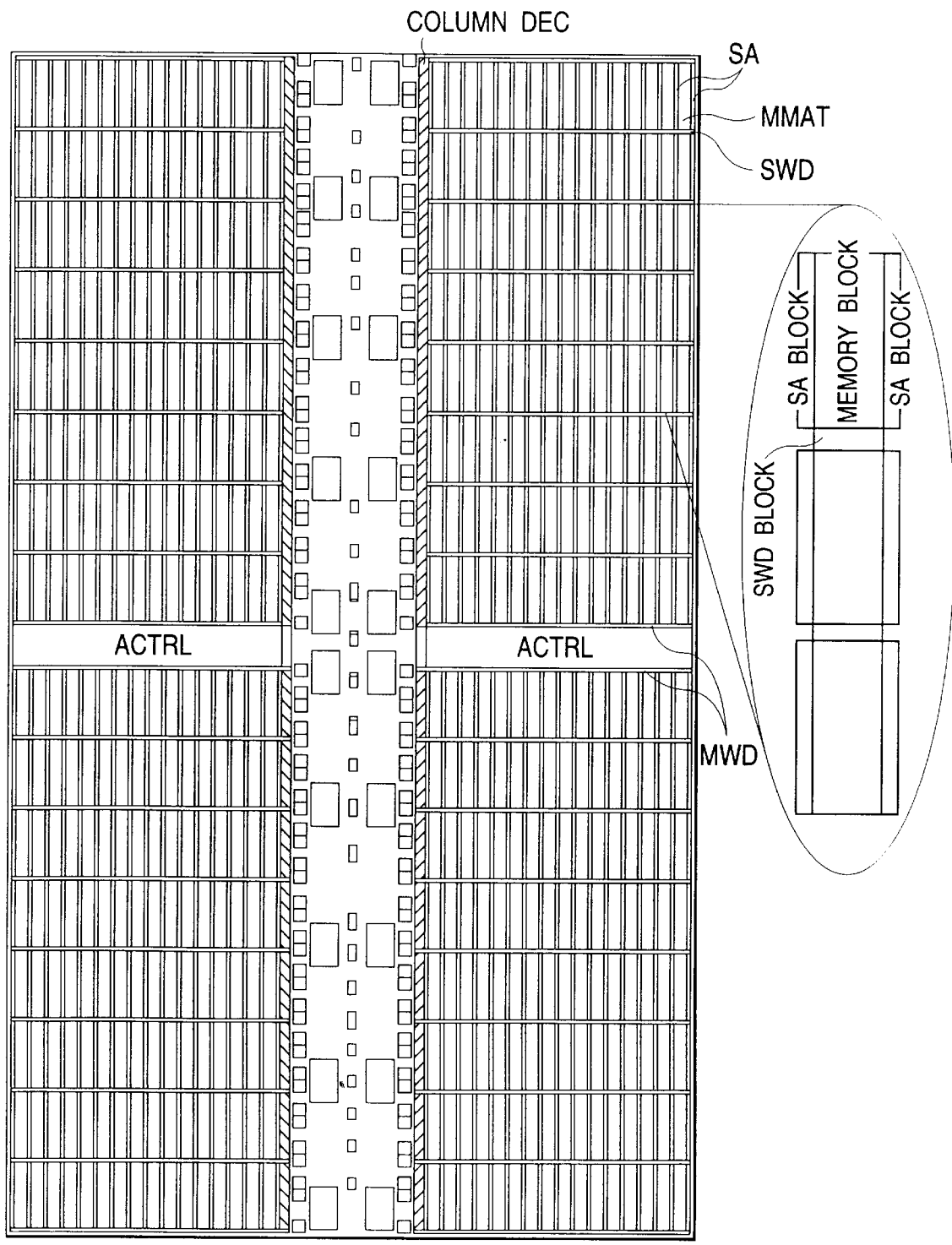
FIG. 1 is a general layout diagram illustrating a dynamic RAM associated with the invention, according to one embodiment thereof.

Referring to FIG. 1, SA denotes a sense amplifier arranged in parallel to the length of the semiconductor chip. Column Dec provided near the center line of the chip denotes a column decoder. ACTRL provided between the upper and lower memory blocks at the center of the chip denotes an array controller for supplying a timing signal necessary for an address decoder and certain operations.

As described above, one memory block has a storage capacity of 4 Kbits in a pair bit line direction. However, connecting memory cells as large as 4 Kbits to one pair bit line increases its parasitic capacitance, thereby making it possible to obtain a signal level to be read by a capacitance ratio with a minute information storage capacitor. Therefore, the memory block is also divided into 16 memory cell arrays in the pair bit line direction. That is, the pair bit line is divided by 16 by the above-mentioned sense amplifier SA. As will be described, the sense amplifier is constituted by way of example by shared sensing. In this constitution, except for the sense amplifiers arranged on both sides of a memory array, the pair bit lines are arranged on the left and right sides of the sense amplifier, which is selectively connected to one of the left and right pair bit lines.

Figure 2:
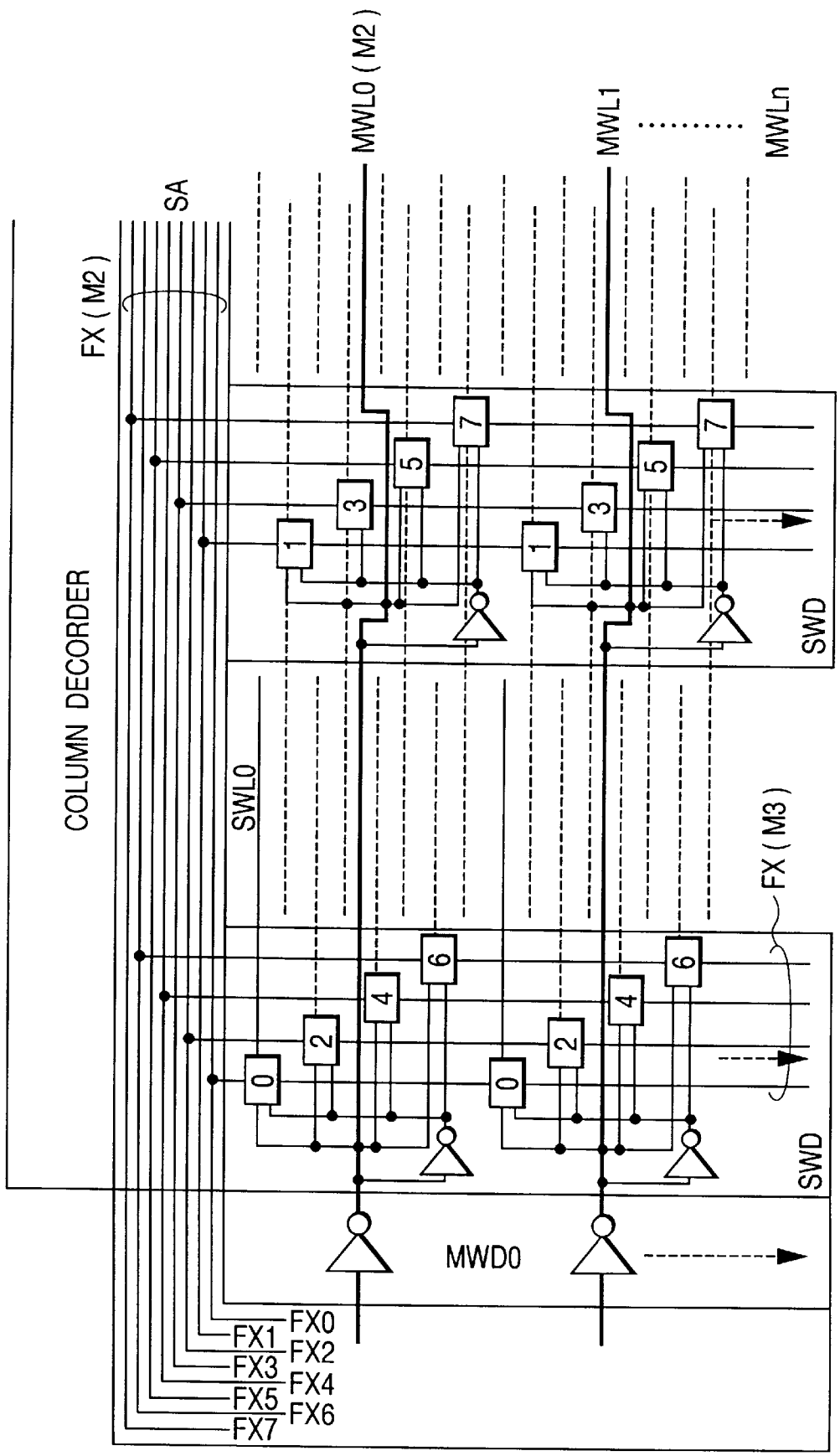
FIG. 2 is a block diagram illustrating a main portion of the dynamic RAM for describing a relationship between the main word line and the sub word line of the memory array of FIG. 1.

FIG. 2 is block diagram illustrating a main portion of the dynamic RAM for describing a relationship between the main word lines and the sub word lines of the above-mentioned memory array. In the figure, two main word lines MWL0 and MWL1 are shown typically. The main word line MWL0 is selected by a main word driver MWD0. The main word line MWL1 is also selected by a similar main word driver.

The above-mentioned one main word line MWL0 is provided with 8 sets of sub word lines along the main word line. In FIG. 2, two sets of sub word lines are shown typically. For the sub word line SWL, even-numbered sub word lines 0 to 6 and odd-numbered sub word lines 1 to 7, a total of 8 sub word lines, are arranged alternately on one memory cell array. Except for the even-numbered sub word lines 0 to 6 adjacent to the main word driver and the odd-numbered sub word lines 1 to 7 arranged at the far end side (the side opposite to the word driver) of the main word line, the sub word driver SWD arranged between the memory arrays forms a select signal for selecting the sub word lines in the memory blocks on both sides of the sub word driver.

As described above, each memory block is divided into eight along the main word line. The sub word lines corresponding to two memory blocks are substantially selected by the sub word driver SWD at the same time. Consequently, each memory block is substantially divided into four. In the above-mentioned constitution where the sub word lines are divided into even-numbered sub word lines 0 to 6 and odd-numbered sub word lines 1 to 7 and the sub word driver SWD is arranged on each side of the memory block, a substantial pitch of the sub word lines SWL arranged densely according to the memory cell arrangement can be mitigated two times in the sub word driver SWD, so that the sub word driver SWD and the sub word line SWL0 can be laid out efficiently.

The above-mentioned sub word driver SWD supplies the select signal commonly to the four sub word lines 0 to 6 (1 to 7). The SWD also supplies an inverted signal via an inverter. In order to select one sub word from the above-mentioned four sub word lines, a sub word select line FX is provided. The sub word select line FX consists of eight lines FX0 through FX7. The even-numbered sub word select lines FX0 to FX6 are supplied to the above-mentioned even-numbered sub word drivers 0 to 6 and the odd-numbered sub word select lines FX1 to FX7 are supplied to the above-mentioned odd-numbered sub word drivers 1 to 7. On the periphery of the array, the sub word select lines FX0 through FX7 are formed by way of example on a metal wiring layer M2, a second layer. On a portion in which the sub word select lines intersect the main word lines MWL0 through MWLn constituted by the metal wiring layer M2, the second layer, the sub word select lines are constituted by a metal wiring layer M3, a third layer.

Figure 3:
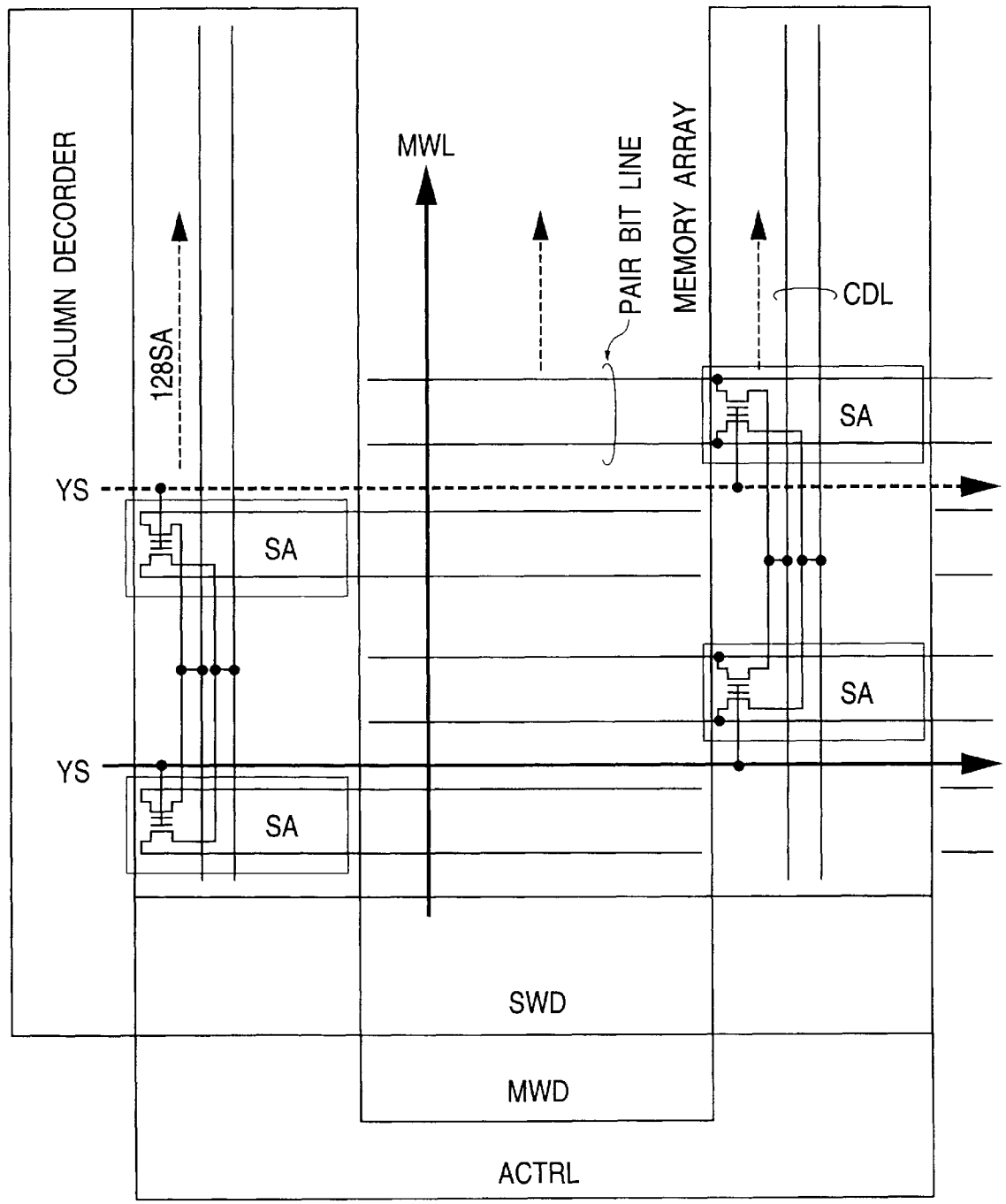
FIG. 3 is a block diagram illustrating a main portion of the dynamic RAM for describing a relationship between the main word line and the sense amplifier of FIG. 1.

FIG. 3 is a block diagram illustrating a main portion of the dynamic RAM for describing a relationship between the above-mentioned main word lines and the above-mentioned sense amplifiers. In the figure, one main word line MWL is shown typically. This main word line MWL is selected by the main word driver MWD. Adjacent to this main word driver, the sub word driver SWD corresponding to the above-mentioned even-numbered sub word lines is provided.

Although not shown in the figure, a pair of bit lines are provided that orthogonally intersect the sub word line arranged in parallel to the main word line MWL. In this embodiment, the pair of bit lines are, for example, divided into even-number and odd-numbered lines, sense amplifiers SA being arranged on the left and right side of the memory array. The sense amplifiers are based on shared sensing as described above. The sense amplifier arranged at an end is not provided with a pair bit line substantially consisting of one line, but is connected to the pair of bit lines via a shared switch MOSFET to be described later.

In the above-mentioned constitution in which sense amplifiers SA are arranged in a distributed manner on both sides of the memory block, the pair of bit lines are divided into odd-number and even-number lines, resulting in a mitigated pitch of the sense amplifiers. In other words, while densely arranging the pair of bit lines, an element area for forming the sense amplifier SA can be allocated. A common data line CDL is arranged along the above-mentioned array of sense amplifiers SA. This common data line CDL is connected to the pair of bit lines via a column switch. The column switch is constituted by a switch MOSFET. The gate of this switch MOSFET is connected to a column select line YS for transmitting a column decoder select signal.

Figure 4:
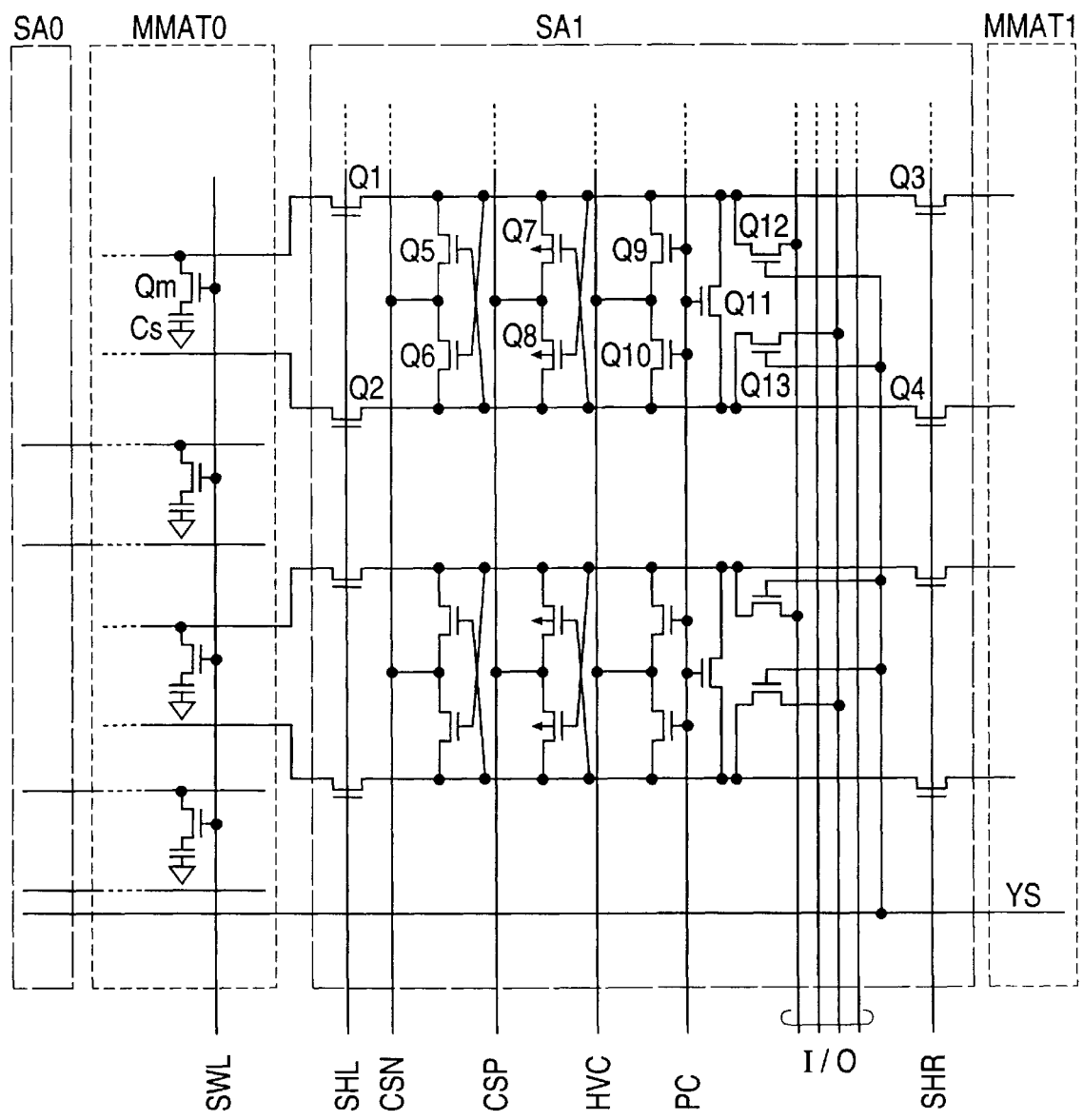
FIG. 4 is a circuit diagram illustrating a main portion of a sense amplifier section of the dynamic RAM associated with this invention, according to one embodiment thereof.

FIG. 4 is a circuit diagram illustrating a main portion of a sense amplifier of the dynamic RAM associated with this invention, practiced as one embodiment thereof. In the figure, a sense amplifer SA1 arranged between memory cell arrays MMAT0 and MMAT1 and circuits associated therewith are illustrated by way of example. The memory cell array (memory mat) MMAT1 is shown as a black box. A sense amplifier SA0 arranged on one end is also shown as a black box.

Four dynamic memory cells are typically illustrated corresponding to the sub word line SWL provided on the memory mat MMAT0. Each dynamic memory cell consists of an address select MOSFET Qm and an information storage capacitor Cs. The gate of the address select MOSFET Qm is connected to the sub word line SWL, the drain is connected to the bit line, and the source is connected to the information storage capacitor Cs. The other electrode of the information storage capacitor Cs is made common, to which a plate voltage is applied.

Pairs of bit lines are arranged in parallel to each other and, in order to balance the bit line capacitance, they cross each other appropriately as required. The pairs of bit lines are connected to an input/output node of a unit circuit of the sense amplifier via shared switches MOSFET Q1 and MOSFET Q2. The unit circuit of the sense amplifier SA1 is composed of N-channel MOSFETs Q5 and Q6 arranged in a latched state in which the source and the drain are cross-connected, and P-channel MOSFETs Q7 and Q8 arranged in a latched state in which the gate and the drain are cross-connected. The sources of the N-channel MOSFETs Q5 and Q6 are connected to a common source line CSN. The sources of the P-channel MOSFETs Q7 and Q8 are connected to a common source line CSP. The common source line CSN is provided with an N-channel power switch MOSFET and the common source line CSP is provided with a P-channel power switch MOSFET. These power switch MOSFETs are turned on by a sense amplifier enable signal, supplying a voltage necessary for sense amplifier operations.

The input/output node of the unit circuit of the sense amplifier is provided with a precharge circuit composed of a MOSFET Q11 to short-circuit the pair of bit lines and switch MOSFETs Q9 and Q10 for supplying a half precharge voltage HVC to the pair bit lines. The gates of these MOSFETs Q9 through Q11 are commonly supplied with a precharge signal PC.

MOSFETs Q12 and Q13 constitute a column switch that is controlled by a column select signal YS. In this embodiment, four pairs of bit lines are selected by one column select signal YS. That is, the sense amplifier SA0 indicated by a black box is also provided with a similar column switch. Thus, the two sense amplifiers SA0 and SA1 on both sides of the memory mat MMAT0 correspond to even-numbered bit lines and the odd-numbered bit lines. Consequently, the above-mentioned column select signal YS can select a total of four pairs of bit lines, namely the two pairs of bit lines illustrated on the side of the sense amplifier SA1 and the two pairs of bit lines not shown on the side of the sense amplifier SA0. These two pairs of bit lines are connected to two pairs of common input/output lines I/O via the above-mentioned column switch.

The sense amplifier SA1 is connected to the odd-number of bit lines in the memory mat MMAT1 via shared switch MOSFETs Q3 and Q4. The even-numbered bit lines of the memory mat MMAT1 are connected to a sense amplifier SA2 not shown on the right side of the memory mat MMAT1 via shared switch MOSFETs corresponding to the above-mentioned shared switch MOSFETs Q1 and Q2. By this repetition, the sense amplifiers provided between memory mats (namely the above-mentioned memory cell arrays) obtained by dividing the memory array are connected sequentially. For example, when the sub word line SWL of the memory mat MMAT0 is selected, the shared switch MOSFET on the right side of the sense amplifier SA0 and the shared switch MOSFET on the left side of the sense amplifier SA1 are turned on. However, in the sense amplifier SA0 arranged at the end of the memory array, only the above-mentioned right-side shared switch MOSFET is provided. A signal SHL denotes a left-side shared select signal and a signal SHR denotes a right-side shared select signal.

Figure 5:
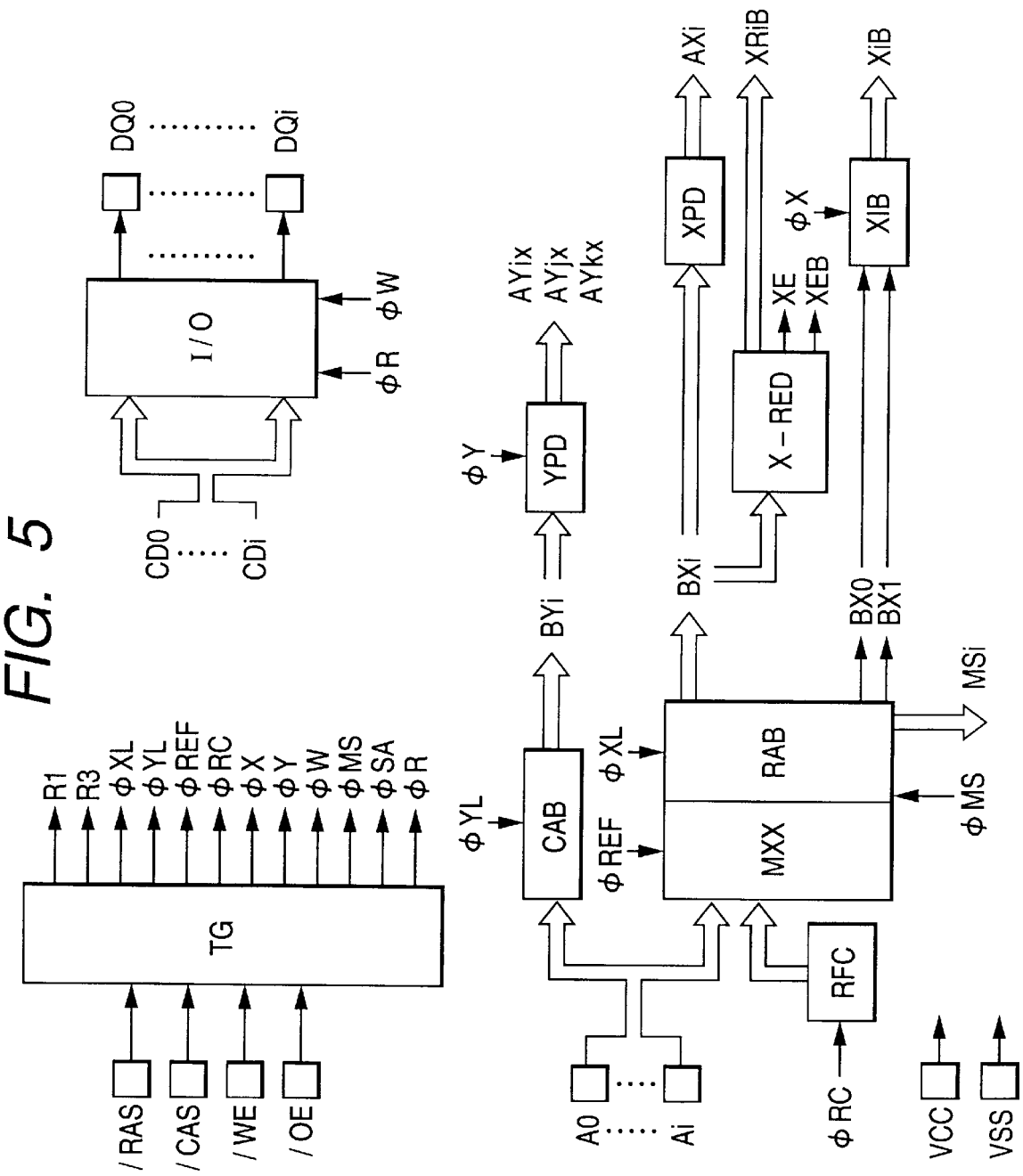
FIG. 5A, FIG. 5B and FIG. 5C are circuit diagrams illustrating a peripheral portion of the dynamic RAM associated with the invention, according to one embodiment thereof.

FIGS. 5A, 5B and 5C are circuit diagrams illustrating a peripheral portion of the dynamic RAM associated with the invention, practiced as one embodiment thereof. A timing controller TG receives a row address strobe signal /RAS, a column address strobe signal /CAS, a write enable signal /WE, and an output enable signal /OE and determines an operation mode and forms various timing signals necessary for the operations of internal circuits according to the determined operation mode. The slash (/) preceding the above-mentioned signals denotes herein, as in well as in the attached drawings, that these signals are active low signals. The peripheral circuits shown in FIG. 5C operate on the supply voltage Vcc supplied via the external terminal and the ground potential Vss.

Referring to FIG. 5A, signals R1 and R3 are row-system internal timing signals and are used for row-system select operations. Timing signal φXL is used to capture a row-system address to hold the captured address and supplied to a row address buffer RAB. That is, the row address buffer RAB captures an address inputted from address terminals A0 to Ai by the above-mentioned timing signal φXL to hold the captured address in a latch circuit.

A timing signal φYL is used to capture a column-system address to hold the same and is supplied to a column address buffer CAB. That is, the column address buffer CAB captures a column address signal inputted from an address terminal by the above-mentioned timing signal φYL and holds the captured column address signal in a latch circuit.

A signal φREF is generated in the refresh mode and is supplied to a multiplexer MXX arranged at the input section of the row address buffer to control the MXX such that switching is made to an address signal for refreshing formed by a refresh address counter RFC in the refresh mode. The refresh address counter RFC generates a refresh address signal by counting an increment pulse φRC for refreshing formed by the timing controller TG. In this embodiment, the auto refresh mode and self refresh mode are provided.

A timing signal φX is a word line select timing signal and is supplied to a decoder XIB by which four word line select timing signals XiB are formed based on a signal obtained by decoding an address signal of low-order two bits. A timing signal φY is a column select timing signal and is supplied to a column-system predecoder YPD, from which column select signals AYix, AYjx, and AYkx are outputted. Based on this column select signal, the column select line YS is selected.

A timing signal φW is a control signal for instructing a write operation. A timing signal φR is a control signal for instructing a read operation. These timing signals φW and φR are supplied to the input/output circuit I/O, as seen in FIG. 5B, to enable the input buffer included in the input/output circuit I/O in a write operation, putting the output buffer into an output high-impedance state. In a read operation, these signals enable the output buffer, putting the input buffer into an output high-impedance state.

A timing signal φMS is a signal for instructing, for example, a memory array select operation. This signal is supplied to the row address buffer RAB, in synchronization with a timing at which a select signal MSi is outputted. A timing signal φSA is a signal for instructing a sense amplifier operation. Based on this signal, an enable pulse SAE for the sense amplifier is formed as will be described later.

In this embodiment, as seen in FIG. 5C, a row-system redundancy circuit X-RED is illustrated typically. To be more specific, the redundancy circuit X-RED includes a memory circuit for storing a failing address and an address comparator. The stored failing address is compared with an internal address signal BXi outputted from the row address buffer RAB. If a mismatch is found, a signal XE is made high and a signal XEB is made low, validating the operation of the normal circuit. If the inputted internal address signal BXi is found matching the failing address, the signal XE is made low to disable the operation of selecting the failing main word line of the normal circuit and the signal XEB is made high to output a select signal XRiB for selecting one standby main word line.

Figure 6:
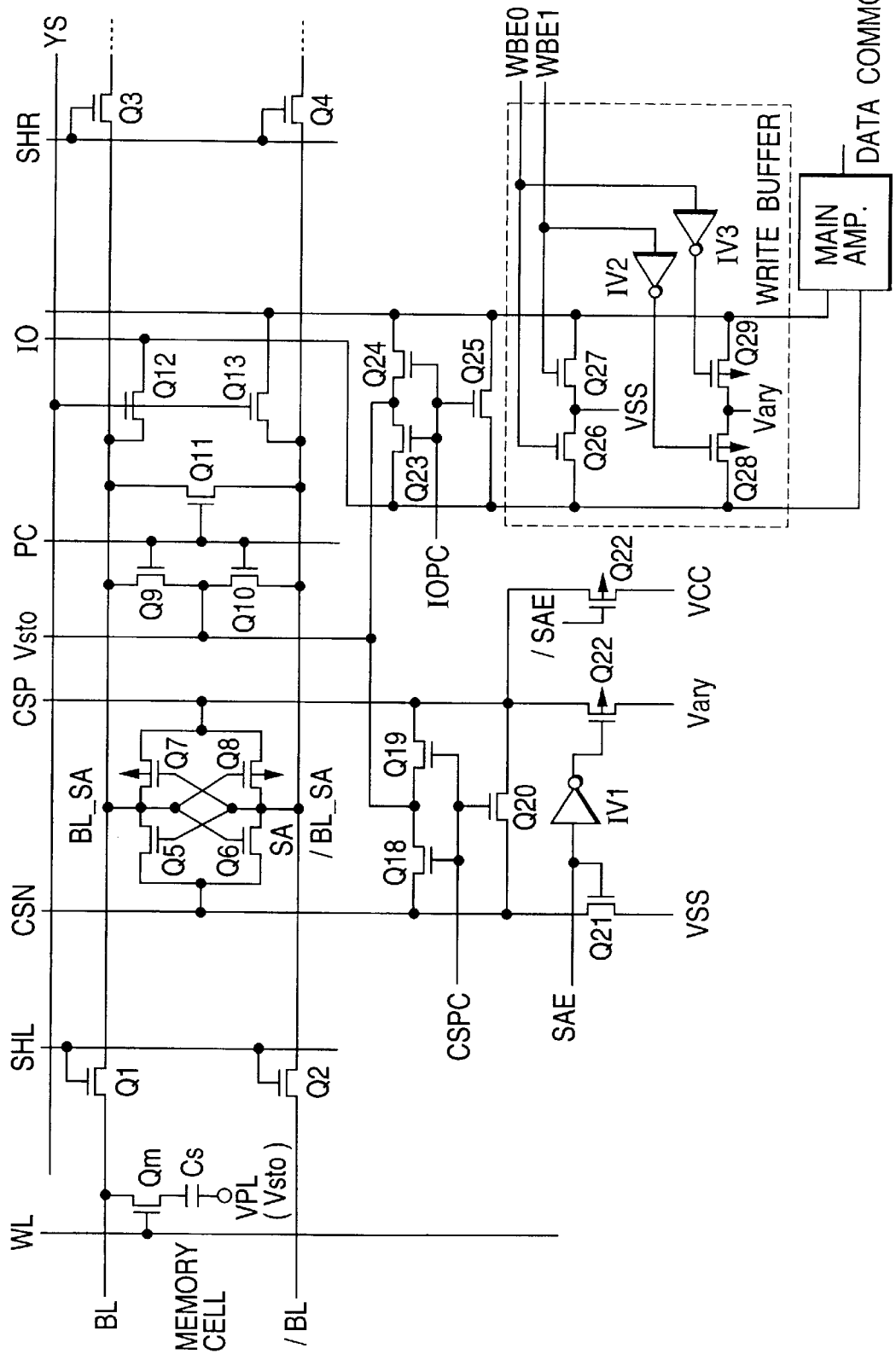
FIG. 6 is a circuit diagram illustrating a main portion of a memory cell array in the dynamic RAM associated with the invention, according to one embodiment thereof.

FIG. 6 is a circuit diagram illustrating a main portion of the memory cell array in the dynamic RAM associated with the invention, according to one embodiment thereof. This figure typically illustrates one word line, a pair of bit lines BL and /BL, a sense amplifier and a precharge circuit associated therewith, and a read-system circuit and a write-system circuit.

The dynamic memory cell consists of an address select MOSFET Qm and an information storage capacitor Cs as described before. The gate of the address select MOSFET Qm is connected to a word line WL. One source and one drain of the MOSFET Qm are connected to a bit line BL. The other source and the other drain are connected to the storage node of the information storage capacitor Cs. The other electrode of the information storage capacitor Cs is made common, to which a plate voltage VPL is applied. If the above-mentioned divided word line scheme consisting of a main word line and a sub word line is used, the above-mentioned word line corresponds, for example, to the sub word line. In this embodiment, to eliminate provision of a booster, the word line select level is a high level such as the supply voltage VCC. To improve the memory cell information retention characteristic, the word line unselect level is a negative level such as a substrate back bias voltage.

The bit lines BL and /BL are arranged in parallel and appropriately crossed for balancing bit line capacitance as required. The pair of bit lines BL and /BL are connected to input/output nodes BL-SA and /BL-SA of the sense amplifier via switch MOSFETs Q1 and Q2. A unit circuit constituting the sense amplifier SA consists of a CMOS (Complementary Metal-Oxide Semiconductor) latch circuit composed of N-channel MOSFETs Q5 and Q6 and P-channel MOSFETs Q7 and Q8 of which the gate and the drain are cross-connected. The sources of the N-channel MOSFETs Q5 and Q6 are connected to a common source line CSN. The sources of the MOSFETs Q7 and Q8 are connected to a common source line CSP. These common source lines CSP and CSN are commonly connected to the sources of a P-channel MOSFET and an N-channel MOSFET similar to those mentioned above in another similar CMOS latch circuit.

The common source line CSP is provided with a P-channel power switch MOSFET Q22. To the gate of MOSFET Q22, an output signal of an inverter IV1 that receives the sense amplifier enable signal SAE is supplied.

The MOSFET Q22 is turned on in synchronization with the high level of the timing signal SAE, thereby dropping the supply voltage VCC to apply a resultant internal voltage Vary to the common source line CSP. The common source line CSN corresponding to the N-channel MOSFETs Q5 and Q6 is also provided with an N-channel power switch MOSFET Q21. The timing signal SAE is supplied to the gate of MOSFET Q21. The MOSFET Q21 is turned on in synchronization with the high level of the timing signal SAE, thereby applying circuit ground potential VSS to the common source line CSN.

The internal drop voltage Vary is used as the sense amplifier operating voltage for the following reason. Since the word line select level is the supply voltage VCC as described above, if the sense amplifier operating voltage is set to the supply voltage VCC and a high-level amplification signal, such as the supply voltage VCC, is applied to the bit line, a voltage to be written to the memory cell information storage capacitor Cs by the threshold voltage of the above-mentioned shared switch MOSFET or the address select MOSFET is only VCC–Vth (where Vth stands for the threshold voltage of these MOSFETS). Therefore, by use of the internal drop voltage Vary, a potential variation in the pair of bit lines BL and /BL is made smaller corresponding to the signal level to be stored in the capacitor Cs, thereby reducing the current consumption therein.

In this embodiment, in order to quicken the sense amplifier operation, a MOSFET Q22' is added, but not necessarily, to the common source line MOSFET Q22. This MOSFET Q22' provides the supply voltage VCC as the sense amplifier operating voltage. To be more specific, when the timing signal SAE changes from low to high, the gate of the MOSFET Q22' is applied with a timing signal /SAE' that is temporarily turned low such that a high operating voltage is temporarily applied to the internal drop voltage Vary as the sense amplifier operating voltage, namely a so-called over drive is performed.

The input/output nodes BL-SA and /BL-SA of the sense amplifier SA are provided with a precharge circuit composed of a short-circuit MOSFET Q11, and switch MOSFETs Q9 through Q11 for supplying a half precharge voltage Vsto (Vary/2) to the pair of bit lines. The gates of these MOSFETs Q9 through Q11 are commonly supplied with a precharge signal SC. The common source lines CSP and CSN of the sense amplifier SA are provided with a precharge circuit composed of a MOSFET Q20 for short-circuiting the common source lines CSP and CSN and switch MOSFETs Q18 and Q19 for supplying a half precharge voltage Vsto. The gates of these MOSFETs are commonly supplied with a precharge signal CSPC.

The input/output nodes BL-SA and /BL-SA of the sense amplifier SA are connected to the input/output line IO via N-channel column switch MOSFETs Q12 and Q13. The gates of the column switch MOSFETs Q12 and Q13 are supplied with a column select signal YS. The input/output line IO is also provided with a precharge circuit composed of MOSFETs Q23 through Q25. When a precharge signal IOPC goes high, the MOSFETs Q23 through A25 are turned on for a half precharge operation. This input/output line IO is connected to the input terminal of a main amplifier (Main Amp). Also, the input/output line IO is connected to the output terminal of a write buffer composed of N-channel MOSFETs Q26 and Q27 for forming a write signal of low level (VSS) and P-channel MOSFETs Q28 and Q29 for forming a write signal of-high level (Vary).

The MOSFETs Q26 through Q29 of the write buffer are controlled by an inverted signal formed by write enable signals WEB0 and WEB1 and inverters IV2 and IV3. When the write enable signal WEB0 is high and the write enable signal WEB1 is low, the MOSFETs Q26 and Q29 are turned on to form a high level/low level write signal. When the write enable signal WEB0 is low and the write enable signal WEB1 is high, the MOSFETs Q27 and Q28 are turned on to form a low level/high level write signal. In other than a write operation, these MOSPETs Q26 through Q29 are turned off, entering the output high-impedance state.

The sense amplifier SA of this embodiment is a so-called shared sense amplifier in which two pairs of bit lines are provided for the input/output nodes BL-SA and /BL-SA. To be more specific, the sense amplifier SA is connected to the left-side bit lines BL and /BL via the shared select MOSFETs Q1 and Q2 for the input/output nodes BL-SA and /BL-SA and connected to the right-side bit lines not shown via the shared select MOSFETs Q3 and Q4. In this embodiment, select signals SHL and SHR are applied to the gates of the shared select MOSFETs Q1 and Q2, Q3 and Q4. The select levels of these select signals SHL and SHR are turned high, such as the supply voltage VCC, like the word line select level. Hence, the shared select MOSFETs Q1 through Q4 are given the same threshold voltage as that of the address select MOSFET Qm of the dynamic memory cell.

When the left-side memory mat is selected, the MOSFETs Q1 and Q2 are kept on by the signal SHL and the signal SHR is turned low to disconnect the bit lines of the right-side memory mat. When the right-side memory mat is selected, the MOSFETs Q3 and Q4 are kept on by the signal SHR and the signal SHL is turned low to disconnect the bit line of the left-side memory mat. In a precharge period with memory access ended, the signals SHL and SHR both go high, precharging both bit lines. For the high level of the signals SHL and SHR, not the boosted high level of a conventional dynamic RAM but the high level of the supply voltage VCC as with the word line WL can be used, so that no booster is required.

Figure 7:
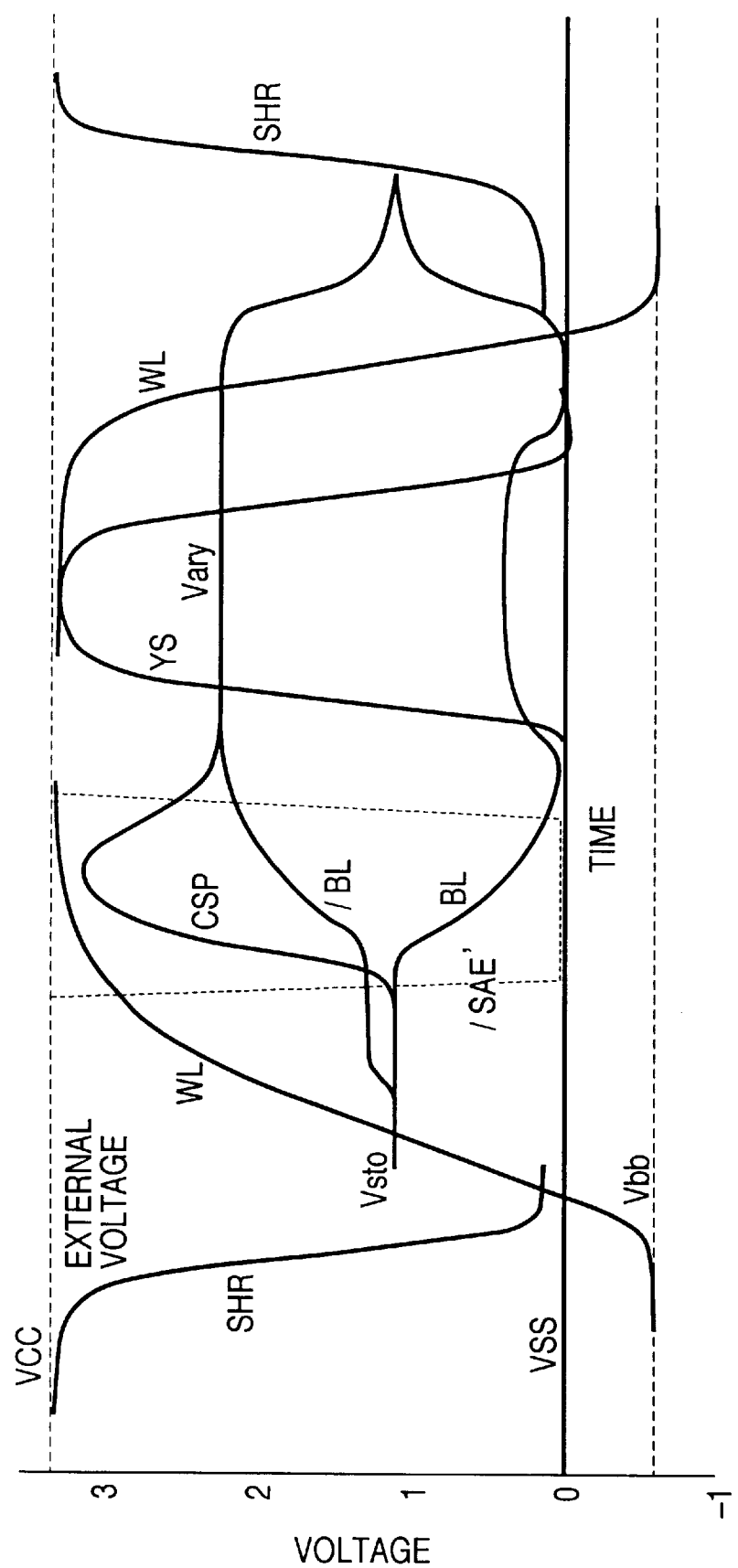
FIG. 7 is a timing diagram for describing an example of the operation of the circuit shown in FIG. 6.

FIG. 7 is a timing diagram for describing an example of the operation of the embodied circuit shown in FIG. 6. In synchronization with the falling of a row address strobe signal /RAS not shown, an address signal is captured. When a row-system select operation is performed, the shared select signal SHR on the unselect side changes from a high level, such as the supply voltage VCC, to a low level, such as circuit ground potential. Then, the word line WL rises from a low level, such as a negative voltage Vbb, to a high level, such as the supply voltage VCC. When the word line rises, one of the bit lines BL and /BL is changed to a minute voltage corresponding to the information charge stored in a selected memory cell.

When a timing signal SAE not shown goes high, the N-channel MOSFET Q21 is turned on, upon which the common source line CSN changes to a low level, such as the circuit ground potential. When the timing signal SAE goes high, the output signal of the inverter IV1 goes low to turn on the P-channel MOSFET Q22, upon which the common source line CSP changes to the internal drop voltage Vary. At this moment, if the over-drive MOSFET Q22' such as of the embodiment of FIG. 6 is provided, a timing signal /SAE' temporarily goes low as indicated by the dotted line in synchronization with the change of the timing signal SAE to a high level, temporarily turning on the MOSFET Q22.

Consequently, the rising of the common source line CSP of the sense amplifier is speeded up, which in turn speeds up the rising of the sense amplifier output to a high level, thereby speeding up the amplifying operation. When the timing signal /SAE' goes back to the high level, the MOSFET Q22' is turned off, upon which the sense amplifier performs an amplifying operation by the internal voltage Vary and circuit ground potential VSS. Consequently, the voltage difference between the input/output nodes BL-SA and /BL-SA of the sense amplifier grows, which varies toward the internal drop voltage Vary and circuit ground potential. This turns the pair bit lines BL and /BL to a high level, such as the internal voltage Vary, and a low level, such as circuit ground potential VSS, via the shared switch MOSFETs Q1 and Q2.

When the column select signal YS goes high, the input/output nodes BL-SA and /BL-SA are connected to the input/output line IO, upon which the low level of the input/output nodes BL-SA and /BL-SA temporarily raises. A level difference corresponding to the amplification signal of the sense amplifier appears on input/output lines IOT and IOB. For the read signals of the input/output lines IOT and IOB, a read signal of high level, such as VCC, and a read signal of low level, such as VSS, are outputted to a data common bus CB to be transmitted to an output circuit not shown.

Although not shown, in a write operation, when the timing signal SAE goes high, the sense amplifier SA begins amplifying as with the above-mentioned read operation. When the column select signal YS goes high, the input/output nodes BL-SA and /BL-SA are connected to the input/output line IO, upon which write signals corresponding to Vary and VSS are transmitted. When the write signal that inverts the information stored in the memory cell is transmitted, the levels of the input/output nodes BL-SA and /BL-SA are inverted. The sense amplifier amplifies the inverted levels to form the supply voltage Vary and the voltage VSS, which are transmitted to the selected memory cells over the bit lines.

If the select levels of the word line and the shared switch MOSFET are set to the supply voltage VCC, no boosted voltage generator need be provided. Consequently, no process is required for forming highly dielectric MOSFETs otherwise used in such a boosted voltage generator and the current otherwise consumed by the boosted voltage generator can be reduced, resulting in saved power. Further, by setting the unselect level of the word line to a negative voltage, such as a substrate back bias voltage, the gate of the address select MOSFET is applied with a bias voltage reverse to the source potential, thereby reducing leakage current that may cause the change in the information storage capacitor to be lost.

If the unselect level of the word line is set to a negative value, such as the substrate back bias voltage, as described above, it is not necessary to increase the threshold voltage of the address select MOSFET. That is, a MOSFET having a low threshold voltage formed by the same fabrication process as that for forming the N-channel MOSFETs constituting peripheral circuits, such as the sense amplifier and the address decoder, can be used without change. Use of such a MOSFET having a low threshold voltage (about 0.6 V) can raise the high level to be given to the pair of bit lines BL and /BL, or set the high level to a comparatively high voltage obtained by lowering the sense amplifier operating voltage Vary by the above-mentioned threshold voltage relative to the supply voltage VCC. This increases the information charge amount.

Figure 8A:
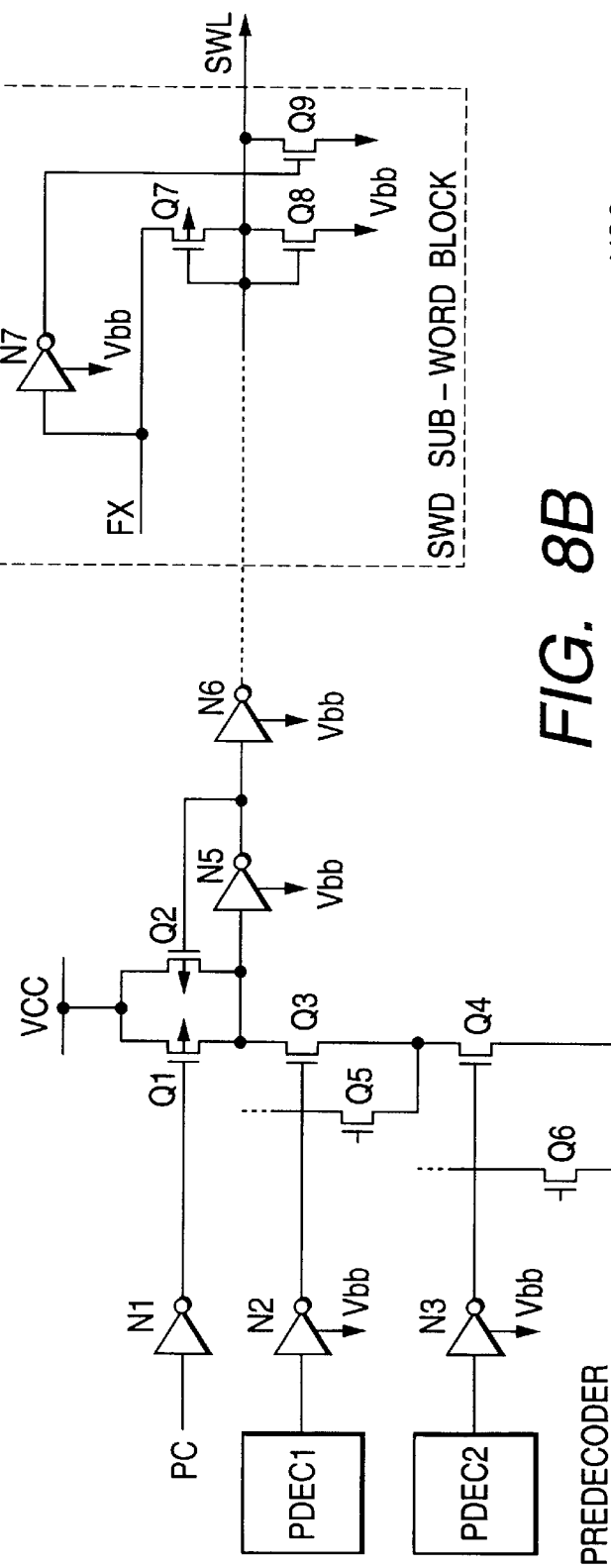
FIG. 8A and FIG. 8B are circuit diagrams illustrating a word line selector for use in the dynamic RAM associated with the invention, according to one embodiment thereof.
Figure 8B:
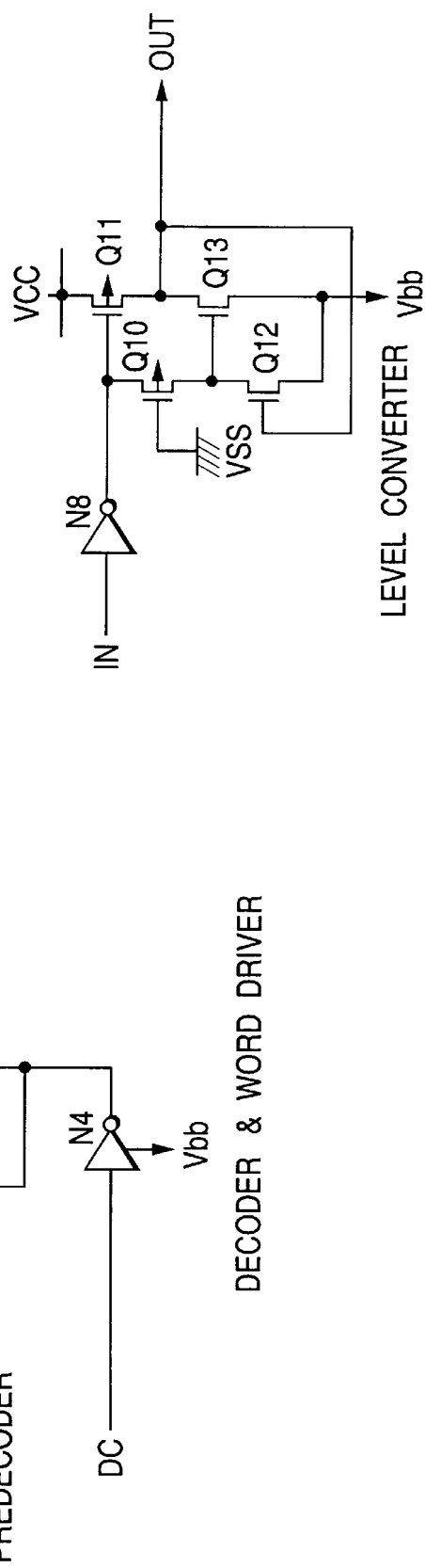

FIG. 8A and FIG. 8B are circuit diagrams illustrating a word line selector for use in the dynamic RAM associated with the invention, according to one embodiment thereof. In FIG. 8A, a decoder, a main word driver, and a sub word driver are typically shown. In FIG. 8B, a level converter for use therein is illustrated. Circuit symbols in FIGS. 8A and 8B are partially the same as those in preceding figures, but it is to be understood that these same circuit symbols are for implementing separate circuit functions.

In FIG. 8A, a P-channel MOSFET Q1 is a precharge MOSFET for precharging the output node to the voltage VCC by the output signal of an inverter N1 that receives a precharge signal PC. The output node is provided with N-channel series MOSFETs Q3 and Q4 forming a discharge path constituting a logical block. The source of this MOSFET Q4 is connected to the output terminal of an inverter N4 that receives a discharge signal DC. That is, during a precharge period, the signal DC goes low to turn the output signal of the inverter N4 to high level. Consequently, during a precharge period in which the signal PC is high, the MOSFET Q1 is turned on, so that, when the output node is precharged, no current path is formed when the series MOSFETs Q3 and Q4 are on, thereby precharging the series path from both sides thereof.

The above-mentioned decoding section is constituted in a tree manner. That is, the output terminal of the inverter N4 branches to the exemplified MOSFETs Q4 and Q6 and the drain side of the MOSFET Q4 branches to the exemplified MOSFETs Q3 and Q5, the drain of the MOSFET Q3 being connected to the above-mentioned output node. The gates of the MOSFETs Q3 and Q5 are supplied with a predecode signal formed by a predecoder PDEC 2. In the figure, two MOSFETs Q3 and Q5 are provided. If four predecode signals are formed by decoding a 2-bit address signal for example, four branches are provided for the four predecode signals.

Likewise, the gates of the MOSFETs Q4 and Q6 are also supplied with a predecode signal formed by a predecoder PDEC 1. In the figure, two MOSFETs Q3 and Q5 are provided. If four predecode signals are formed by decoding a 2-bit address signal for example, four MOSFETs are provided for the four predecode signals.

In the above-mention decoding section, one of the predecode signals formed by the predecoders PDEC1 and PDEC2 is set to the select level and only the MOSFETs constituting one path in the above-mentioned tree structure are turned on, thereby forming a discharge path. Then, when the discharge signal DC goes high, a current flows along one discharge path selected as indicated above, thereby setting the output node from high level to low level.

In the figure, the inverters N2, N3, and N4 are, for example, CMOS inverters that operate on the supply voltage VCC and the negative voltage Vbb. The inputs of these inverters N2 through N4 are supplied with a predecode signal having a signal amplitude such as VCC–Vbb and a discharge signal. The signal having such a signal amplitude is formed by a level converter shown in FIG. 8B.

As shown in FIG. 8B, when the level converter forms an output signal OUT of the same phase for the input terminal IN, an input signal IN is inverted by an inverter N8. This inverter N8 operates on the supply voltage VCC and the voltage VSS like an ordinary CMOS circuit. Therefore, the output signal of the CMOS inverter circuit N8 is a CMOS level signal; namely the high level is the supply voltage VCC and the low level is the circuit ground potential VSS.

In order to convert the above-mentioned CMOS level signal to a signal amplitude consisting of a positive voltage and a negative voltage, such as VCC and Vbb, a pair of N-channel MOSFETs Q12 and Q13, whose sources are connected to the above-mentioned negative voltage Vbb, are cross-connected to each other at the gate and drain to be put in a latched state. Between the drain of the MOSFET Q12 and the signal input terminal, a P-channel MOSFET Q10 of which gate is connected to the ground potential VSS is provided. Between the drain of the MOSFET Q13 and the supply voltage VCC, a P-channel MOSFET Q11 is provided whose gate provides the above-mentioned signal input terminal. That is, to this signal input terminal, the output signal of the above-mentioned CMOS inverter N8 is applied.

In the above-mentioned constitution, when the signal input is high, the MOSFET Q11 is turned off and the MOSFET Q10 is turned on. When the MOSFET Q10 is turned on, the gate of the MOSFET Q13 is supplied with the high level of the above-mentioned signal input. This turns on the MOSFET Q13, setting the output terminal OUT to a low level, such as the negative voltage Vbb. This low level turns off the MOSFET Q12. When the signal input is low, the MOSFET Q11 is turned on and the MOSFET Q16 is turned off. When the MOSFET Q11 is turned on, the output terminal OUT is turned high, so that the MOSFET Q12 is turned on. When the MOSFET Q12 is turned on, the MOSFET Q13 is turned off, so that the high level of the output terminal OUT is turned high, such as to the supply voltage VCC.

Since the input signals having signal amplitudes such as VCC and Vbb are supplied to the decoding section, the operating voltages of the decoder section are voltages such as the supply voltage VCC and the Vbb. That is, to maintain the unselect output node at high level, the output node is provided with a P-channel MOSFET Q2 to which the output signal of the inverter N5 that receives the output signal of the output node is supplied. This MOSFET Q2 consists of a small current supply capability MOSFET that only compensates a leak current of the output node. The MOSFET Q2 constitutes a latch circuit in which, when the output node is turned high, the output signal of the inverter N5 is turned low, thereby turning on the MOSFET Q2. Since the MOSFET Q2 has a small current supply capability, when the MOSFETs Q3 and Q4 are turned on, the output node can be discharged, thereby forming a low-level select signal.

A main word line select signal is formed through the inverters N5 and N6. The inverters N5 and N6 operate on the supply voltage VCC and the negative voltage Vbb and form output signals having corresponding signal amplitudes. The inverters N5 and N6 constitute a word driver. That is, in order to operate the main word line at high speeds, the inverter N6 consists of a comparatively large-size CMOS inverter circuit. Since the input capacity of such an CMOS inverter circuit is comparatively large, the inverter N5 is provided to drive the CMOS inverter circuit at high speeds.

A sub word section forms a select signal for selecting one sub word line SWL together with the sub word line select signal FX of the main word line. That is, in one memory cell array (or memory mat), four odd-numbered and even-numbered sub word lines are allocated to the main word line, so that one of the four sub word lines is selected by the above-mentioned signal FX. That is, the main word line is supplied to the input terminal of a CMOS inverter consisting of P-channel MOSFETs Q7 and Q8. The sub word line SWL is connected to the output of this CMOS inverter. Between the output of this CMOS inverter and the negative voltage Vbb, an N-channel MOSFET Q9 is provided. For the operating voltage of this CMOS inverter, the high level of the above-mentioned signal FX is used. In order to fix the sub word line SWL with the main word put in the select state and the signal FX put in the unselect state to the low level, an inverter N7 is provided and the output signal thereof is supplied to the gate of the above-mentioned MOSFET Q9.

For example, when the main word line is low, or at a select level, the above-mentioned P-channel MOSFET Q7 is turned on and the N-channel MOSFET Q8 is turned off. At this moment, the high level of the signal FX is transmitted through the P-channel MOSFET Q7 which is on to the sub word line SWL, putting the same in a select state. If the signal FX is low, the output signal of the inverter N7 goes high, turning on the N-channel MOSFET Q9, so that the sub word line is fixed to low level (Vbb), or the select level. When the main word line is high, or the unselect level, the P-channel MOSFET Q7 is turned off and the N-channel MOSFET Q8 is turned on. Consequently, regardless of the high and low levels of the signal FX, the sub word line SWL is fixed to the low or unselect level.

Figure 9:
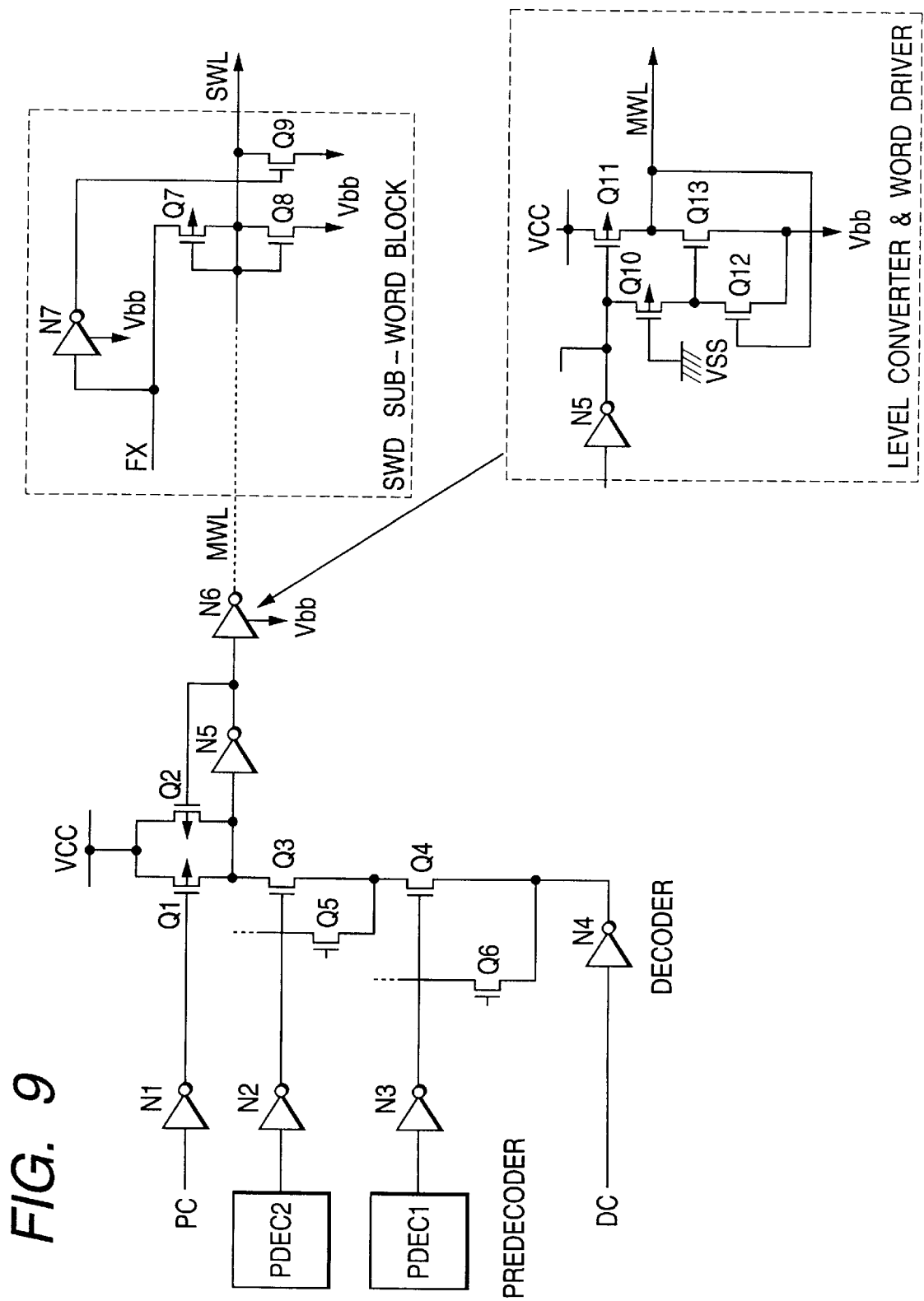
FIG. 9 is a circuit diagram illustrating the word line selector for use in the dynamic RAM associated with the invention, according to another embodiment thereof.

FIG. 9 is a circuit diagram illustrating the word line selector for use in the dynamic RAM associated with the invention, according to another embodiment thereof. In the figure, a decoding section, a main driver, and a sub word driver are illustrated for example. In this embodiment, the word line selecting circuit consists of an ordinary CMOS circuit operating on supply voltage VCC and circuit ground potential VSS, including predecoders PDEC 1 and PDEC 2, and a decoding section. An inverter N6 for forming select and unselect signals of the main word line MWL is a word driver having the above-mentioned level converting capability. That is, the level converter shown in FIG. 8B is used without change as the word line driver N6.

In this constitution, only the main word line MWL and the sub word driver operate on VCC–Vbb, thereby mitigating the load of the negative voltage generator. Further, the predecoder and the circuit for forming a precharge signal PC and a discharge signal DC do not require the above-mentioned level converter, resulting in a simplified circuit constitution. This level converter may be provided only on the sub word driver; however, the number of sub drivers is far greater than the number of main drivers, so that this attachment of the level converter increases the number of circuit elements as a whole. Preferably, the level converter is provided only on the main word drivers for reducing the number of circuit elements.

Figure 10:
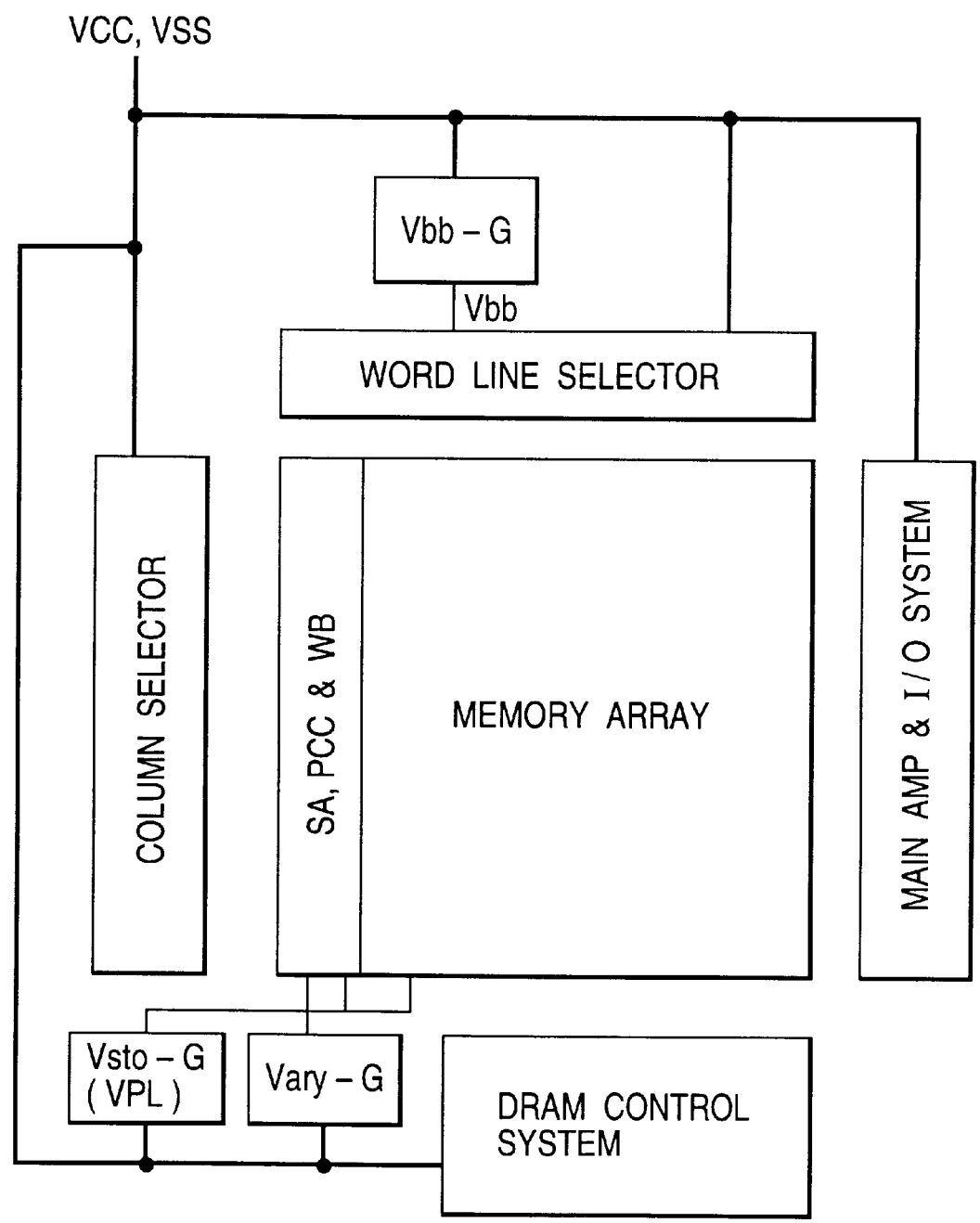
FIG. 10 is a general block diagram illustrating an electrical system of the dynamic RAM associated with the invention, according to one embodiment thereof.

FIG. 10 is a general block diagram illustrating a power supply system for a dynamic RAM associated with the invention, according to one embodiment thereof. The supply voltage composed of the supply voltage VCC supplied from the external terminal and the circuit ground potential VSS is supplied to a column-system selector, a word line selector, a main amplifier and an I/O system, and a DRAM control system. The supply voltage is also supplied to three types of internal voltage generators. A negative voltage generator Vbb-G is a known substrate back bias voltage generator that receives the above-mentioned supply voltage VCC and the circuit ground potential VSS and is composed of an oscillator such as a ring oscillator and a charge pump circuit for forming a negative voltage by the oscillation pulse formed by the oscillator. In order to stabilize this negative voltage and prevent wasted current consumption from occurring, a controller is, for example, as one provided that monitors the substrate voltage and intermittently performs a charge pump operation.

An internal voltage generator Vary-G is a step-down circuit for forming a voltage obtained by level-shifting the supply voltage VCC by the threshold voltage of MOSFET and is basically constituted by a source follower of an N-channel MOSFET. A voltage generator Vsto-G forms a bit line precharge voltage Vsto and a plate voltage VPL. This voltage generator also forms a voltage obtained by level-shifting the supply voltage VCC by the threshold voltage of a MOSFET and dividing the obtained voltage by two. Since the precharge voltage Vsto and the plate voltage VPL are equal, they may be made common; but in order to prevent these voltage from being affected by each other, these voltages are outputted from separate drivers.

The negative voltage Vbb formed by the negative voltage generator Vbb-G is supplied not only to the above-mentioned word line selector but also to the P-well region on which a memory array is formed as a substrate back bias voltage. The precharge voltage Vsto is used by a precharge circuit PCC and the plate voltage VPL is transmitted to the capacitor of a memory cell. The internal voltage Vary is given as the operating voltage for a sense amplifier SA and a write buffer WB.

Figure 11:
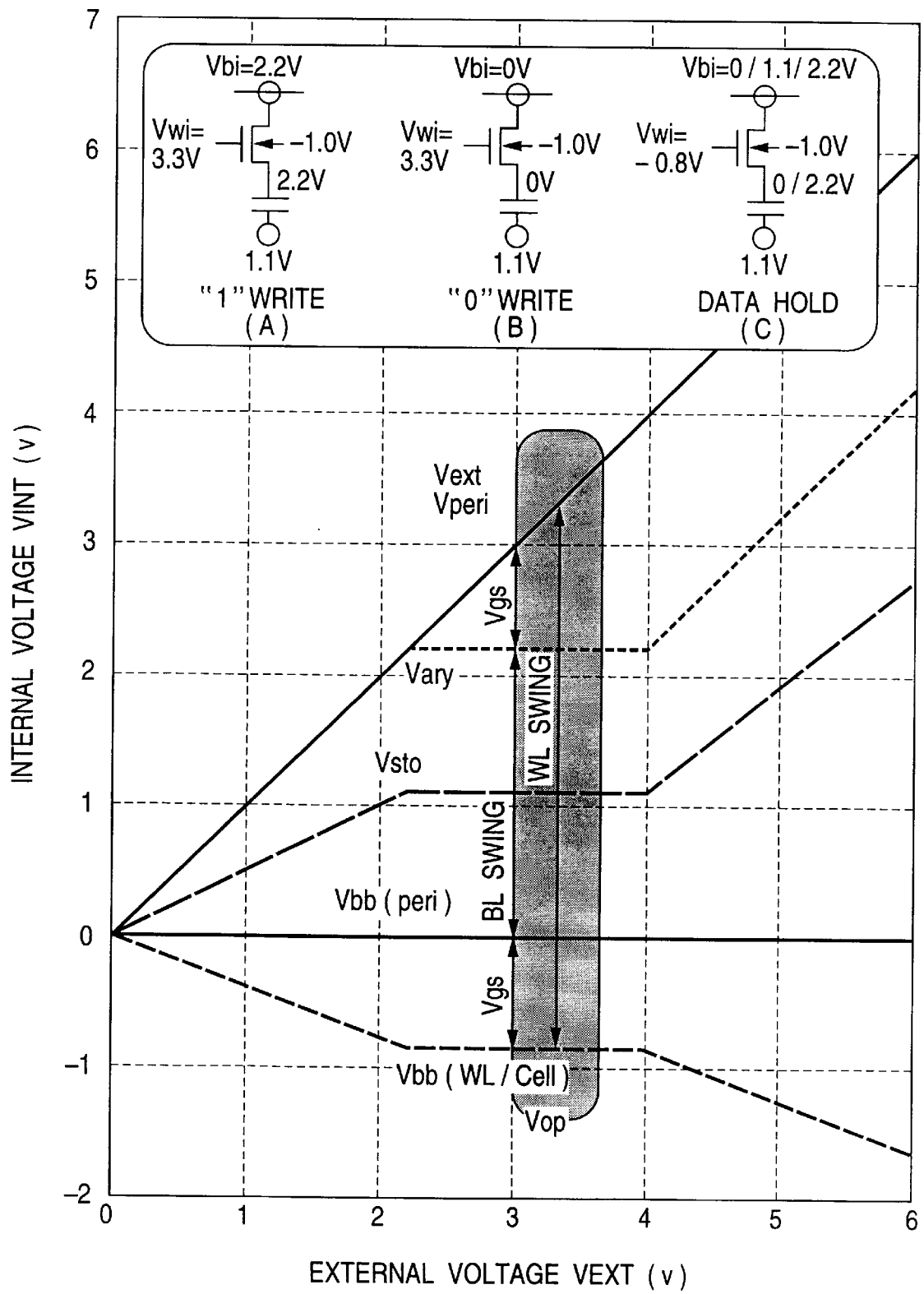
FIG. 11 is a characteristic diagram of the electrical system in the dynamic RAM associated with the invention.

FIG. 11 is a diagram illustrating characteristics of the power supply system of the dynamic RAM associated with the invention. The horizontal axis indicates external supply voltage and the vertical axis indicates an internal operating voltage. In a range where the external supply voltage VCC is about 2V to 4V, the internal voltage generator forms the predetermined voltages Vbb, Vsto, and Vary with stability. This embodiment is assumed to operate on the supply voltage of about 3 V. Therefore, by setting the internal voltage Vary to about 2.2 V, the voltage difference Vgs with the supply voltage VCC becomes larger than the threshold voltage of a MOSFET, thereby making it possible to write the high level of a bit line according to the internal voltage Vary to the information capacitor of a memory cell without boosting the word line. In addition, the negative voltage Vbb is set to about –0.8 V, so that the word line unselect level is accordingly set to –0.8 V. If the threshold voltage of the address select MOSFET for selecting a dynamic memory cell is set to the same low threshold voltage as that of a peripheral circuit MOSFET, a desired data retention characteristic can be obtained. When the supply voltage VCC goes over 4V, the internal voltage is raised accordingly. This is performed to efficiently perform acceleration tests such as burn-in.

In FIG. 11, (A) through (C) show memory cell potentials by way of example. (A) shows a high-level ("1") write state, in which the gate voltage connected to a word line is set to 3.3 V, writing the high level 2.2 V of bit line to the capacitor. (B) shows a low-level ("0") write state, in which the gate voltage connected to a word line is set to 3.3 V, writing the low level 0V of bit line to the capacitor. (C) shows a data retention state, in which the gate voltage connected to a word line is set to the unselect level of –0.8 V at which the bit line is set to high/low levels of 0 V and 2.2 V in the write/read states and to a half precharge voltage 1.1 V in a standby state. Since the information retention voltage of the capacitor is 0 V or 2.2 V and the gate of the address select MOSFET is set to the above-mentioned negative voltage, if the bit line or the information retention voltage is 0 V, a reverse bias voltage such as –0.8 V is applied, thereby preventing a leakage current that keeps the information charge from flowing.

Figure 12A:
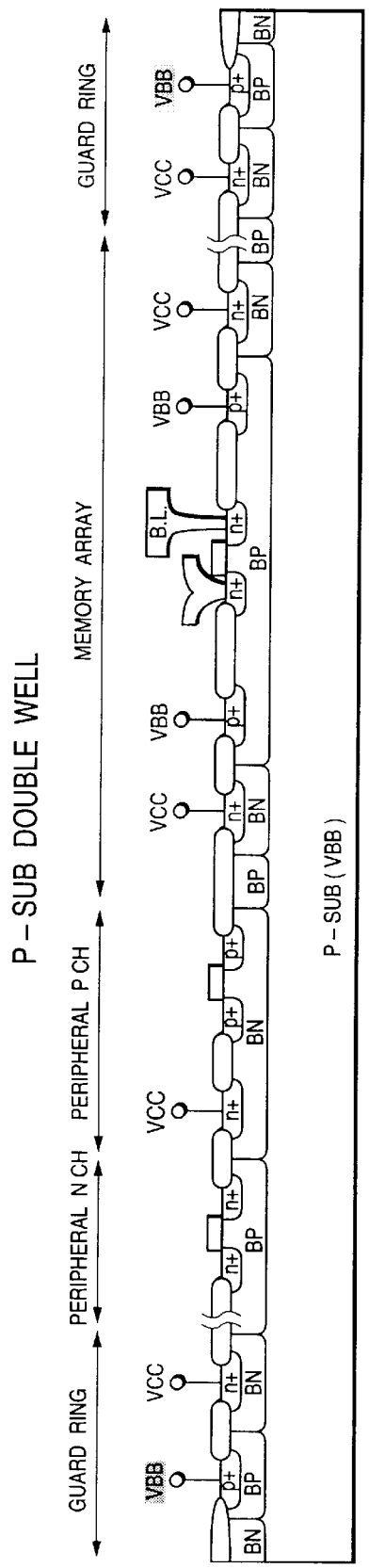
FIG. 12A and FIG. 12B are cross sections illustrating a device structure for the dynamic RAM associated with the invention.
Figure 12B:
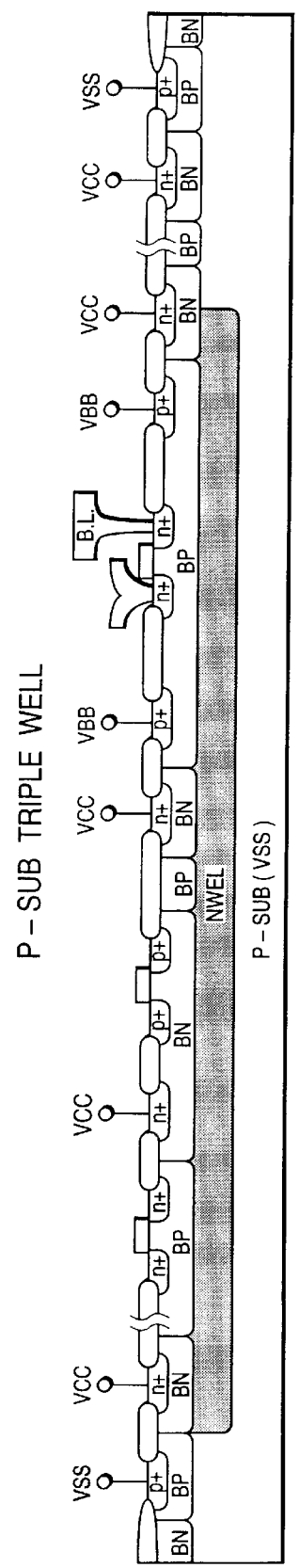

FIG. 12A and FIG. 12B are cross sections of a device structure for describing the dynamic RAM associated with the invention. FIG. 12 A shows an example of a double well structure by using a P-SUB. FIG. 12 B shows an example of a triple well structure by using P-SUB. In the P-SUB double well structure of FIG. 12A, the semiconductor substrate is a P-type P-SUB. The N-channel MOSFETs constituting the memory array and its peripheral circuits are not directly formed on the P-type substrate, but are formed on a P-well region BP formed on the P-type substrate. The P-channel MOSFETs are formed on the N-well region BN formed on the P-type substrate. In order to prevent the small number of carriers generated in the peripheral circuit from reaching the semiconductor region on which the memory array is formed and reaching the storage node of a memory cell to result in loss of the information charge, a guard ring for absorbing these carriers is provided.

In the embodiment of FIG. 12A, the substrate back bias voltage VBB (=Vbb) is supplied to the substrate P-SUB. That is, while the well region has a double structure of BN and BP for simplified fabrication process, the negative voltage VBB is supplied to the substrate P-SUB as a back bias voltage, so that the threshold voltage of the N-channel MOSFETs for the sense amplifier and peripheral circuits rises, thereby delaying the operation speed.

In the embodiment of FIG. 12B, circuit ground potential VSS is given to the substrate P-SUB. For isolation from the substrate P-SUB, the substrate peripheral portion on which the memory array, sense amplifier, sub word decoder, and so on are formed is provided with a deep N-well region NWEL. The supply voltage VCC is applied to the N-well region NWEL as a bias voltage for electrical isolation from the substrate P-SUB. Provision of this deep N-well region NWEL forms a triple well structure along with the P-well region BP and the N-well region BN.

A substrate back bias voltage consisting of the negative voltage VBB is applied to the P-well region BP on which the memory array is formed and which is formed on the deep N-well region NWEL. This raises the threshold voltage of the address select MOSFET. On the other hand, the circuit ground potential VSS is applied to the P-well region BP on which N-channel MOSFETs constituting peripheral circuits such as the sense amplifier are formed (not shown). This provides a low threshold voltage in the peripheral circuits, thereby increasing the operation speed. Likewise, the supply voltage VCC is applied as a bias voltage to the N-well region BP on which P-channel MOSFETs are formed. The well region on which the N-channel MOSFETs constituting the peripheral circuits such as an address decoder, an address buffer, and a controller and the P-channel MOSFETs are formed on the N-well region BN and the P-well region BP formed on the substrate P-SUB.

When the above-mentioned triple well structure is applied to the embodiment of FIG. 1, the deep N-well region NWEL can be formed commonly in the above-mentioned four memory blocks. That is, if a boosted voltage is not used, but the supply voltage VCC is used for the select level of the word line to which a memory cell is connected, the supply voltage VCC is applied, like the deep N-well region NWEL, to the N-well region BN on which the P-channel MOSFET constituting the word driver is formed. Consequently, the deep N-well region NWEL is not isolated by the above-mentioned sequence of sense amplifiers. This constitution eliminates the necessity for providing a space for forming the deep N-well region by the sequence of sense amplifiers, thereby reducing the area occupied by the memory blocks. If the word line select level is a boosted voltage higher than the supply voltage Vcc, the N-well on which the P-channel MOSFET is formed constituting the word driver must be set to the boosted voltage level, so that this N-well must be arranged outside the above-mentioned deep N-well. Consequently, this N-well must be formed in separated manner in a one memory block.

Figure 13A:
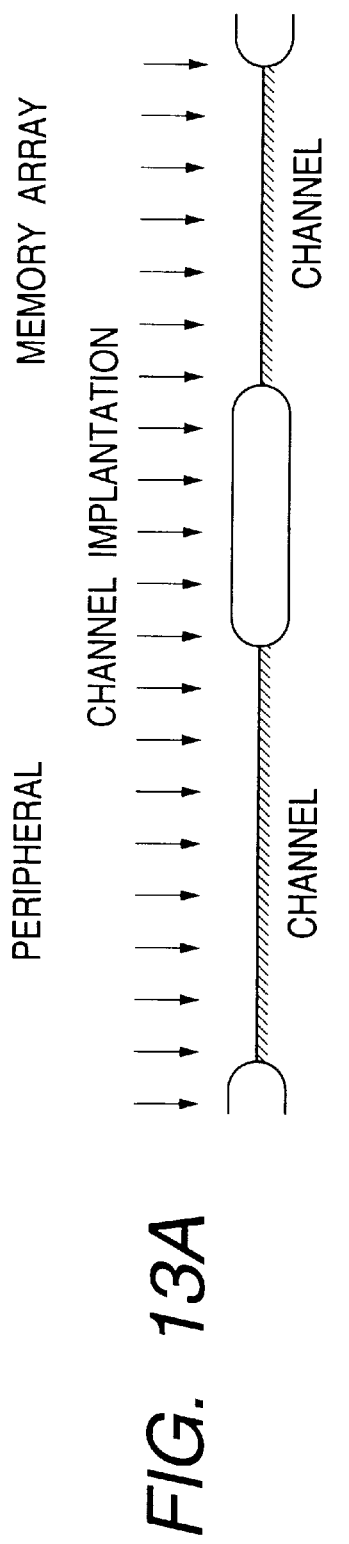
FIG. 13A and FIG. 13B, and FIG. 13C are cross sections illustrating a main portion of the dynamic RAM associated with the invention for describing a fabrication process, according to one embodiment thereof.
Figure 13B:
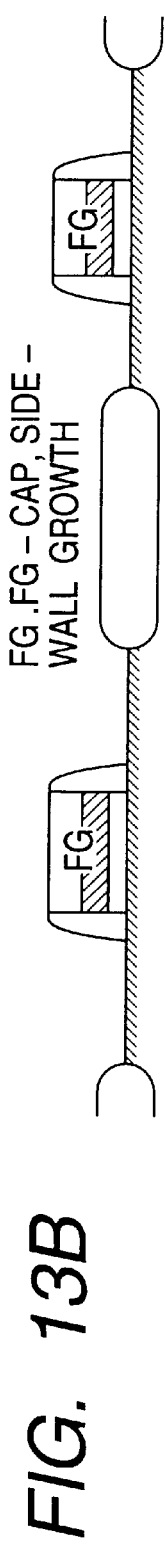
Figure 13C:
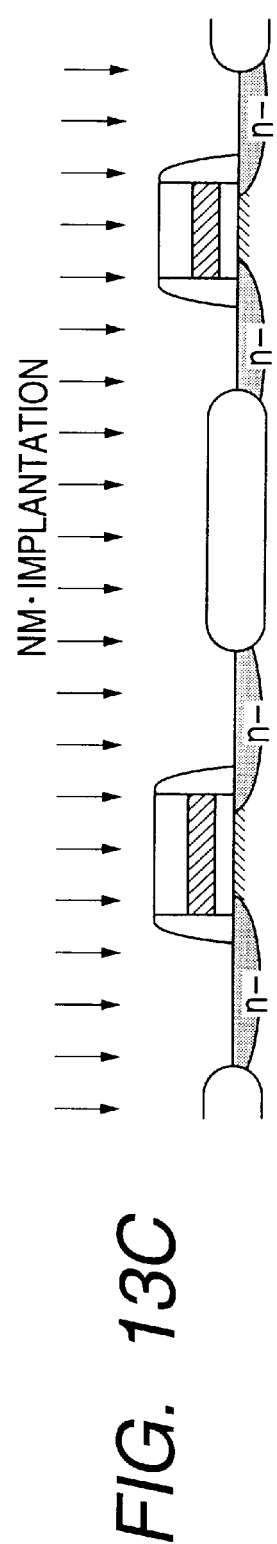

FIG. 13A, FIG. 13B, and FIG. 13C are cross sections illustrating main portions of the dynamic RAM associated with the invention for describing a fabrication process of the dynamic RAM, practiced as one embodiment thereof. In the figure, an N-channel MOSFET of the memory array section and an N-channel MOSFET of a peripheral circuit section are illustrated by way of example. In FIG. 13A, a field insulation film is formed, except on a device forming region. Using the field insulation film as a mask, ion implantation for setting an impurity concentration of the channel region is performed. In the semiconductor integrated circuit of this embodiment, the memory array section and the peripheral circuit section are ion-implanted in the same process. As a result of the ion implantation, these N-channel MOSFETs come to have a low threshold voltage of about 0.6 V.

In FIG. 13B, a polysilicon layer FG of the first layer, an FG cap, and sidewalls are formed. In FIG. 13C, ion implantation (NM implantation) is performed to form the source and drain of low concentration n⁻ for making the dynamic RAM highly dielectric. In this embodiment, the N-channel MOSFETs for constituting another circuit block formed on the same semiconductor integrated circuit on which the memory array section, the peripheral circuit section, and dynamic RAM are formed can also be formed in generally the same process as above, resulting in a simplified fabrication process.

FIG. 14A, FIG. 14B, FIG. 14C, FIG. 14D, and FIG. 14E are cross sections illustrating main portions of the dynamic PAM associated with the invention for describing the fabrication process of the dynamic RAM, practiced as another embodiment of the invention. In the figure, the N-channel MOSFET of the memory array section and the N-channel MOSFET of the peripheral circuit section are illustrated by way of example. Processes of FIG. 14A through FIG. 14C are the same those mentioned above, except for some portions. That is, in FIG. 14A, a field insulation film is formed except on the device forming region. Using the field insulation film as a mask, ion implantation for setting an impurity concentration of the channel region is performed. In the semiconductor integrated circuit of this embodiment, the memory array section and the peripheral circuit section are ion-implanted in the same process. As a result of the ion implantation, these N-channel MOSFETs come to have a low threshold voltage of about 0.6 V.

In FIG. 14B, a polysilicon layer FG of the first layer and an FG cap are formed. In FIG. 14C, ion implantation (NM implantation) is performed to form the source and drain of low concentration n⁻ for making the dynamic RAM highly dielectric. In FIG. 14D, sidewalls are formed on gate electrodes. In FIG. 14E, ion implantation (NH implantation) is performed for forming the high-concentration n+ source and drain for forming the source and drain regions on the above-mentioned gate side by using these side walls as masks. In this embodiment, the N-channel MOSFETs for constituting another circuit block formed on the same semiconductor integrated circuit on which the memory array section, the peripheral circuit section, and dynamic RAM are formed can also be formed in generally the same process as above, resulting in a simplified fabrication process.

The following advantages are obtained from the above-mentioned embodiments.

(1) In a dynamic RAM having a memory cell array in which a dynamic memory cell is arranged at an intersection between a word line and one of pair bit lines, the select level corresponding to a supply voltage and the unselect level corresponding to a negative potential lower than circuit ground potential are supplied to the word line, a signal of a memory cell read to the pair bit lines by a sense amplifier that operates on the circuit ground potential and an internal voltage formed by dropping the supply voltage by an amount equivalent to the threshold voltage of the address select MOSFET is amplified, and the negative voltage is generated by a negative voltage generator that receives the supply voltage and the circuit ground potential, the negative voltage generator being composed of an oscillator and a charge pump circuit for receiving an oscillation pulse formed by the oscillator. This novel constitution can eliminate the necessity for providing a voltage booster to lower the power consumption and, at the same time, share a deep N-well region by memory blocks composed of memory cell arrays, sub word drivers, and sense amplifiers in divided word line scheme to reduce the layout area.

(2) The sense amplifier is composed of a power switch consisting of a P-channel MOSFET and an N-channel MOSFET for supplying an operating voltage and a circuit ground potential to a CMOS latch circuit. Use of a first P-channel MOSFET for supplying the above-mentioned internal voltage and a second P-channel MOSFET that is on only during a certain period at the beginning of a sense operation to supply the above-mentioned supply voltage reduces the power consumption due to the reduced bit line signal amplitude.

(3) The sense amplifier is a shared sense amplifier which is provided commonly between a pair of bit lines and a shared switch MOSFET is provided between the pair of bit lines and the input/output node of the sense amplifier. This novel constitution allows the shared switch MOSFET to be turned on by the supply voltage level like a word line.

(4) By setting the word line unselect level to a negative voltage, an address select MOSFET can be formed by the same fabrication process as that by which the N-channel MOSFETs constituting peripheral circuits including an address selector consisting of N-channel MOSFETs for address-selecting the word lines and pair bit lines.

(5) Of the word line selectors for forming the word line select signal, at least the word driver for forming the select signal for selecting a word line connected to a memory cell operates on the supply voltage and the negative voltage and another peripheral circuit including a column selector for forming the pair bit line select signal operates on the supply voltage and the circuit ground potential. This novel constitution can reduce the load of the negative voltage.

(6) The well region formed with a MOSFET constituting a memory block composed of a memory cell array arranged with the dynamic memory cells in matrix form, the sense amplifier, the precharge circuit for precharging the pair bit lines, and a column switch for selecting the pair bit lines is formed in a common deep N-well, so that a P-well formed with an N-channel MOSFET is electrically isolated, the P-well formed with the memory cell is supplied with the negative voltage as a back bias voltage, and another P-well is given the circuit ground potential. This novel constitution further improves the data retention characteristics while speeding up the operation of the peripheral circuits.

(7) The well region formed with a MOSFET constituting a memory block composed of a memory cell array arranged with the dynamic memory cells in matrix, the sense amplifier, the precharge circuit for precharging the pair bit lines, and a column switch for selecting the pair bit lines is formed in a common P-type semiconductor substrate to which the negative voltage is supplied as a back bias voltage. This novel constitution allows use of double well structure, resulting in a simplified fabrication process.

(8) The word line selector uses a level converter composed of a first N-channel MOSFET and a second N-channel MOSFET of which the source is supplied with the negative voltage and of which the gate and the drain are cross-connected to put the first N-channel MOSFET and the second N-channel MOSFET in a latch form, a first P-channel MOSFET of which the source drain path is connected between the drain of the first N-channel MOSFET and an input terminal and of which the gate is supplied with circuit ground potential, and a second P-channel MOSFET of which the source drain path is connected between the supply voltage and the drain of the second N-channel MOSFET and of which the gate is connected to the input terminal, the input terminal being supplied with word line select/unselect signals consisting of the supply voltage/ground potential, thereby forming output signals of the supply voltage/negative voltage from a drain connection point between the second N-channel MOSFET and the second P-channel MOSFET. Use of the CMOS circuit that operates on the above-mentioned supply voltage and negative voltage can form the word line select and unselect signals.

(9) The word line consists of a main word line and a plurality of sub word lines commonly allocated to the main word line, the word line being set to a select/unselect signal composed of the supply voltage and the negative voltage at least in the main word line. This novel constitution allows the sub word driver to be constituted by a CMOS circuit, thereby reducing the number of circuit elements as a whole.

While the preferred embodiments of the present invention have been described using specific terms, such a description is for illustrative purposes only, and it is to be understood that changes and variations may be made without departing from the spirit or scope of the appended claims. For example, in order to speed up the falling of the negative voltage at the time of the power-on sequence, the substrate back bias generator may be provided with a charge pump circuit for strongly generating a negative voltage and a charge pump circuit that operates regularly and indirectly. By switching between these circuits appropriately, a low power consumption and a fast falling of the negative voltage may be implemented. Further, a control capability may be added in which, by outputting the negative voltage on a monitor, memory access is disabled until the negative voltage reaches a level at which a desired data retention characteristic is satisfied. In the above-mentioned constitution, the negative voltage of the word line is formed commonly by the substrate bias voltage generator. The unselect level of the word line may be formed separately from the substrate bias voltage.

The word line selector is not limited to that of the word line divided scheme composed of main word lines and sub word lines. The word line selector may be constituted in which a word line connected to memory cells is provided for each word driver for each memory block. The present invention is widely applicable to a dynamic RAM.

As mentioned above and according to the invention, the following effects can be obtained typically. That is, in a dynamic RAM having a memory cell array in which a dynamic memory cell is arranged at an intersection between a word line and one of pair bit lines, the select level corresponding to a supply voltage and the unselect level corresponding to a negative potential lower than circuit ground potential are supplied to the word line, a signal of a memory cell read to the pair bit lines by a sense amplifier that operates on the circuit ground potential and an internal voltage formed by dropping the supply voltage by an amount equivalent to the threshold voltage of the address select MOSFET is amplified, and the negative voltage is generated by a negative voltage generator that receives the supply voltage and the circuit ground potential, the negative voltage generator being composed of an oscillator and a charge pump circuit for receiving an oscillation pulse formed by the oscillator. This novel constitution can eliminate the necessity for providing a voltage booster to lower the power consumption and, at the same time, share a deep N-well region by memory blocks composed of memory cell arrays, sub word drivers, and sense amplifiers in divided word line scheme to reduce the layout area. This novel constitution eliminates the necessity for providing a boosted voltage generator to lower the power consumption. At the same time, in the divided word line scheme, the deep N-well region can be commonly used for the memory blocks on which memory cell arrays, sub word drivers, and sense amplifiers are formed.

What is claimed is:

1. A dynamic memory comprising:
    a dynamic memory cell including an address select MOSFET having a gate which is connected to a word line and a source drain path which is connected between one line of a pair of bit lines intersecting said word line and a storage node of an information storage capacitor;
    a word line selector which supplies to said word line a select level corresponding to an external supply voltage and an unselect level corresponding to a negative potential lower than a circuit ground potential;
    a precharge circuit which sets said pair of bit lines to a predetermined voltage;
    a sense amplifier that is operated by an internal voltage obtained by dropping said external supply voltage by an amount equivalent to a threshold voltage of said address select MOSFET and by said circuit ground potential, receives a differential potential between a signal voltage read to said one line of said pair of bit lines and precharge voltage of the other line of said pair of bit lines formed by charge distribution of a pre-charged charge of said one line of said pair of bit lines and a storage charge of said dynamic memory cell, and amplifies said differential potential to form an amplified signal corresponding to said internal voltage and said circuit ground potential; and
    a negative voltage generator including an oscillator and a precharge pump circuit which receives an oscillation pulse formed by said oscillator to generate said negative voltage.

2. A dynamic memory according to claim 1, wherein said sense amplifier includes a CMOS latch circuit in which an input and an output of two CMOS inverter circuits are cross-connected, each of said inverter circuits including a P-channel MOSFET and an N-channel MOSFET, and a first power switch circuit and a second power switch circuit giving an operation voltage and a circuit ground potential to said CMOS latch circuit, said first power switch circuit supplying said operation voltage including a first MOSFET for supplying said internal voltage and a second MOSFET that is turned on only in a certain period at the beginning of a sense operation to give said external supply voltage.

3. A dynamic memory according to claim 1 or 2, wherein said sense amplifier is a shared sense amplifier provided between pairs of bit lines, a shared switch MOSFET being provided between said pairs of bit lines and an input/output node of said sense amplifier.

4. A dynamic memory according to claim 1, 2 or 3, wherein said address select MOSFET consists of an N-channel MOSFET and is formed in generally the same fabrication process for an N-channel MOSFET constituting a peripheral circuit including an address selector for address-selecting said word line and said pair of bit lines.

5. A dynamic memory according to claim 4, wherein, of said word line selector for forming a select signal of said word line, at least a word driver for forming the select signal of the word line connected to a memory cell uses said external supply voltage and said negative voltage as an operation voltage and a column selector for forming a select signal for selecting said pairs of bit lines operates on said external supply voltage and said circuit ground potential.

6. A dynamic memory according to claim 1, wherein a well region formed with a MOSFET constituting a memory block including a memory cell array arranged with said dynamic memory cells in matrix form, said sense amplifier, said precharge circuit, and a column switch which selects said pair of bit lines is formed in a common N-well, so that a P-well formed with an N-channel MOSFET is electrically isolated, said P-well formed with said memory cell is supplied with said negative voltage as a back bias voltage, and another P-well is given said circuit ground potential.

7. A dynamic memory according to claim 1, wherein a well region formed with a MOSFET constituting a memory block including a memory cell array arranged with said dynamic memory cells in matrix form, said sense amplifier, said precharge circuit, and a column switch which selects said pair of bit lines is formed on a common P-type semiconductor substrate to which said negative voltage is supplied as a back bias voltage.

8. A dynamic memory according to claim 1, wherein said word line selector uses a level converter including a first N-channel MOSFET and a second N-channel MOSFET having a common source which is supplied with said negative voltage and the gate and drain of which are cross-connected, a first P-channel MOSFET having a source drain path which is connected between the drain of said first N-channel MOSFET and an input terminal and a gate which is supplied with circuit ground potential, and a second P-channel MOSFET having a source drain path which is connected between said external supply voltage and the drain of said second N-channel MOSFET and a gate which is connected to said input terminal, said input terminal being supplied with one of a high level signal corresponding to said external supply voltage and a low level signal corresponding to said ground potential, thereby forming one of the high level signal corresponding to said external supply voltage and the low level signal corresponding to said negative voltage from a drain connection point between said second N-channel MOSFET and said second P-channel MOSFET.

9. A dynamic memory according to claim 1, wherein said word line is divided into a plurality of word lines along a main word line and a main word selector is provided for supplying a select level corresponding to said external supply voltage and an unselect level set to said negative voltage to said main word line.

10. A dynamic memory comprising:

a plurality of word lines;

a pair of bit lines intersecting said plurality of word lines;

a plurality of dynamic memory cells each having an information storage capacitor and an address select MOSFET;

a first external supply terminal which receives a supply voltage;

a second external supply terminal which receives a ground potential;

a word line selector which supplies a voltage corresponding to said supply voltage to a selected word line of said plurality of word lines and a negative voltage lower than said ground potential to an unselect word line of said plurality of word lines;

a precharge circuit which supplies a predetermined precharge voltage to said pair of bit lines; and a sense amplifier connected to said pair of bit lines;

wherein said address select MOSFET has a gate connected to one of said plurality of word lines and a source drain path connected between one of said pair of bit lines and a storage node of said information storage capacitor;

wherein said sense amplifier including a CMOS latch circuit having a pair of P-channel MOSFETs and a pair of N-channel MOSFETS, a first power switch circuit which supplies an operating voltage to a common source of said pair of P-channel MOSFETs, and a second power switch circuit which supplies an operating voltage to a common source of said pair of N-channel MOSFETs, said first power switch circuit having a first MOSFET which supplies an internal voltage lower than said supply voltage to the common source of said pair of P-channel MOSFETs and a second MOSFET which supplies said supply voltage to the common source; and wherein said sense amplifier receives said supply voltage and said ground potential at the beginning of a sense operation, then operates by receiving said internal voltage and said ground potential, and amplifies a differential potential between a voltage appearing on one line of said pair of bit lines connected to a selected dynamic memory cell and said precharge voltage appearing on the other line of said pair of bit lines, thereby providing said internal voltage and said ground potential on said pair of bit lines.

11. A dynamic memory according to claim 10, further comprising:

a step-down circuit;

wherein said step-down circuit lowers a voltage from said supply voltage to a voltage equivalent to a threshold voltage of an N-channel MOSFET constituting said address select MOSFET, thereby forming said internal voltage.

12. A dynamic memory comprising:

a plurality of word lines;

a plurality pairs of bit lines intersecting said plurality of word lines;

a plurality of dynamic memory cells each having an information storage capacitor and an N-channel MOSFET;

a pair of common data lines;

a plurality of column switches arranged between said plurality pairs of bit lines and said pair of common data lines;

a first external supply terminal which receives a supply voltage;

a second external supply terminal which receives a ground potential;

a precharge circuit which supplies a predetermined precharge voltage to said pair of bit lines;

a word line selector which supplies a voltage corresponding to said supply voltage to a selected word line of said plurality of word lines and a negative voltage lower than said ground potential to an unselect line of said plurality of word lines;

a column decoder which forms a select signal for selecting said plurality of column switches; and a sense amplifier connected to said plurality of pairs of bit lines;

wherein said N-channel select MOSFET has a gate connected to one of said plurality of word lines and a source drain path provided between one line of the pair of bit lines and a storage node of said information storage capacitor;

wherein said plurality of sense amplifiers amplify, in each of said plurality of pairs of bit lines, a differential potential between a voltage appearing on one line of the bit lines connected to a selected dynamic memory cell and said precharge voltage appearing on the other line of bit lines, thereby providing an internal voltage lower than said supply voltage and said ground potential on said pair of bit lines; and wherein said N-channel MOSFET constituting each of said plurality of dynamic memory cells and an N-channel MOSFET included in said column decoder are formed by generally the same fabrication process.

13. A dynamic memory according to claim 12, further comprising:

a step-down circuit;

wherein said step-down circuit lowers a voltage from said supply voltage to a voltage equivalent to a threshold voltage of an N-channel MOSFET constituting said address select MOSFET, thereby forming said internal voltage.

14. A dynamic memory comprising:

a plurality of word lines;

a plurality pairs of bit lines intersecting said plurality of word lines;

a plurality of dynamic memory cells each having an information storage capacitor and an N-channel MOSFET;

a first external supply terminal which receives a supply voltage;

a second external supply terminal which receives a ground potential;

a word line selector which supplies a voltage corresponding to said supply voltage to a selected word line of said plurality of word lines and a negative voltage lower than said ground potential to an unselect line of said plurality of word lines;

a plurality of sense amplifiers connected to said plurality of pairs of bit lines;

wherein said N-channel MOSFET has a gate connected to one of said plurality of word lines and a source drain path provided between one of the pair of bit lines and a storage node of said information storage capacitor;

wherein said plurality of sense amplifiers each having a CMOS latch circuit including a pair of P-channel MOSFETs and a pair of N-channel MOSFETs and said plurality of sense amplifiers amplify, in each of said plurality of pairs of bit lines, a differential potential between a voltage appearing on one line of the bit lines connected to a selected dynamic memory cell and a precharge voltage appearing on the other line of the bit lines, thereby providing an internal voltage lower than said supply voltage and said ground potential on said pair of bit lines; and wherein a first P-well region, in which a source and a drain of the N-channel MOSFET in each of said dynamic memory cells are formed, and a second P-well region, in which a source and a drain of the N-channel MOSFET in each of said plurality of sense amplifiers are formed, are formed in a common N-well region, a source and a drain of a P-channel MOSFET in said word line selector are formed in said common N-well region, said negative voltage is supplied to said first P-well region, said ground potential is supplied to said second P-well region, and said supply voltage is supplied to said common N-well region.

15. A dynamic memory comprising:

a memory block including a plurality of memory cell arrays arranged in a matrix form, a plurality of sense amplifying sections arranged between the memory cell arrays adjacent each other in an X direction, and a plurality of sub word line drivers arranged between the memory cell arrays adjacent each other in a Y direction;

a plurality of main word lines each extending on said plurality of memory cell arrays in the Y direction;

a main word line driver arranged at an end portion of said memory block for supplying a signal to said plurality of main word lines;

a first external supply terminal which receives a supply voltage; and a second external supply terminal which receives a ground potential;

wherein each of said plurality of memory cell arrays has a plurality of sub word lines, a plurality of pairs of bit lines intersecting said plurality of sub word lines, and a plurality of dynamic memory cells each having an information storage capacitor and an N-channel MOSFET, and said address select MOSFET has a gate connected to one of said plurality of sub word lines and a source drain path provided between one line of the pair of bit lines and a storage node of said information storage capacitor;

wherein each of said plurality of sense amplifying sections has a plurality of sense amplifiers connected to said plurality of pairs of bit lines and each of said sense amplifiers has a CMOS latch circuit having a pair of P-channel MOSFETs and a pair of N-channel MOSFETs and amplifies, in each of said plurality of pairs of bit lines, a differential potential between a voltage appearing on one line of the pair of bit lines connected to a selected dynamic memory cell and said precharge voltage appearing on the other line of the pair of bit lines, thereby providing said internal voltage and said ground potential on said pair of bit lines; and wherein each of said plurality of sub word line drivers has a sub word line selector which supplies a voltage corresponding to said supply voltage to a sub word line to be selected of said plurality of sub word lines and a negative voltage lower than said ground potential to an unselect word line of said plurality of sub word lines.

16. A dynamic memory according to claim 15, wherein a first P-well region, in which a source and a drain of the N-channel MOSFET in each of said plurality of memory cells are formed, and a second P-well region, in which a source and a drain of the N-channel MOSFET in each of said plurality of sense amplifying sections are formed, are formed in a common N-well region, a source and a drain of a P-channel MOSFET of each of said plurality of sub word line drivers are formed in said common N-well region, said negative voltage is supplied to said first P-well region, said ground potential is supplied to said second P-well region, and said supply voltage is supplied to said common N-well region.

* * * * *